(12) United States Patent
Hruska

(10) Patent No.: US 10,703,654 B2
(45) Date of Patent: Jul. 7, 2020

(54) NON-THERMAL MULTIPLE PLASMA GATE DEVICES

(71) Applicant: Pear Labs LLC, Blue Springs, MO (US)

(72) Inventor: Christopher D. Hruska, Blue Springs, MO (US)

(73) Assignee: Pear Labs LLC, Blue Springs, MO (US)

( * ) Notice: Subject to any disclaimer, the term of this patent is extended or adjusted under 35 U.S.C. 154(b) by 0 days.

(21) Appl. No.: 16/673,439

(22) Filed: Nov. 4, 2019

(65) Prior Publication Data

US 2020/0140294 A1 May 7, 2020

Related U.S. Application Data

(60) Provisional application No. 62/756,893, filed on Nov. 7, 2018.

(51) Int. Cl.
*H01J 37/32* (2006.01)
*C02F 1/46* (2006.01)
*B01D 53/32* (2006.01)

(52) U.S. Cl.
CPC .......... *C02F 1/4608* (2013.01); *B01D 53/32* (2013.01); *H01J 37/32009* (2013.01); *H01J 37/32568* (2013.01); *B01D 2259/818* (2013.01); *H01J 2237/045* (2013.01); *H01J 2237/327* (2013.01); *H01J 2237/338* (2013.01)

(58) Field of Classification Search
CPC .......... H01J 37/32082; H01J 37/32091; H01J 37/32165; H01J 37/32174; H01J 37/32183
USPC ..................................... 315/111.21
See application file for complete search history.

(56) References Cited

U.S. PATENT DOCUMENTS

2004/0000875 A1\* 1/2004 Vahedi .............. H01J 37/32082
315/111.71
2017/0169996 A1\* 6/2017 Ui ..................... H01J 37/32091
2018/0226225 A1\* 8/2018 Koh ................... H01J 37/32045

\* cited by examiner

*Primary Examiner* — Tung X Le
(74) *Attorney, Agent, or Firm* — Hovey Williams LLP

(57) ABSTRACT

A plasma gate device comprises a plasma creation chamber, first through fourth dielectrics, and first through sixth electrodes. The plasma creation chamber is a space in which plasma is created from a first fluid and a second fluid. The first and second dielectrics form upper and lower boundaries on a first side of the plasma creation chamber. The third and fourth dielectrics form upper and lower boundaries on a second side of the plasma creation chamber. The first and second electrodes receive voltages to generate a first electric field which creates a first plasma on the first side of the plasma creation chamber. The third and fourth electrodes receive voltages to generate a second electric field which creates a second plasma on the second side of the plasma creation chamber. The fifth electrode extracts electrons from the first plasma. The sixth electrode injects electrons into the second plasma.

20 Claims, 11 Drawing Sheets

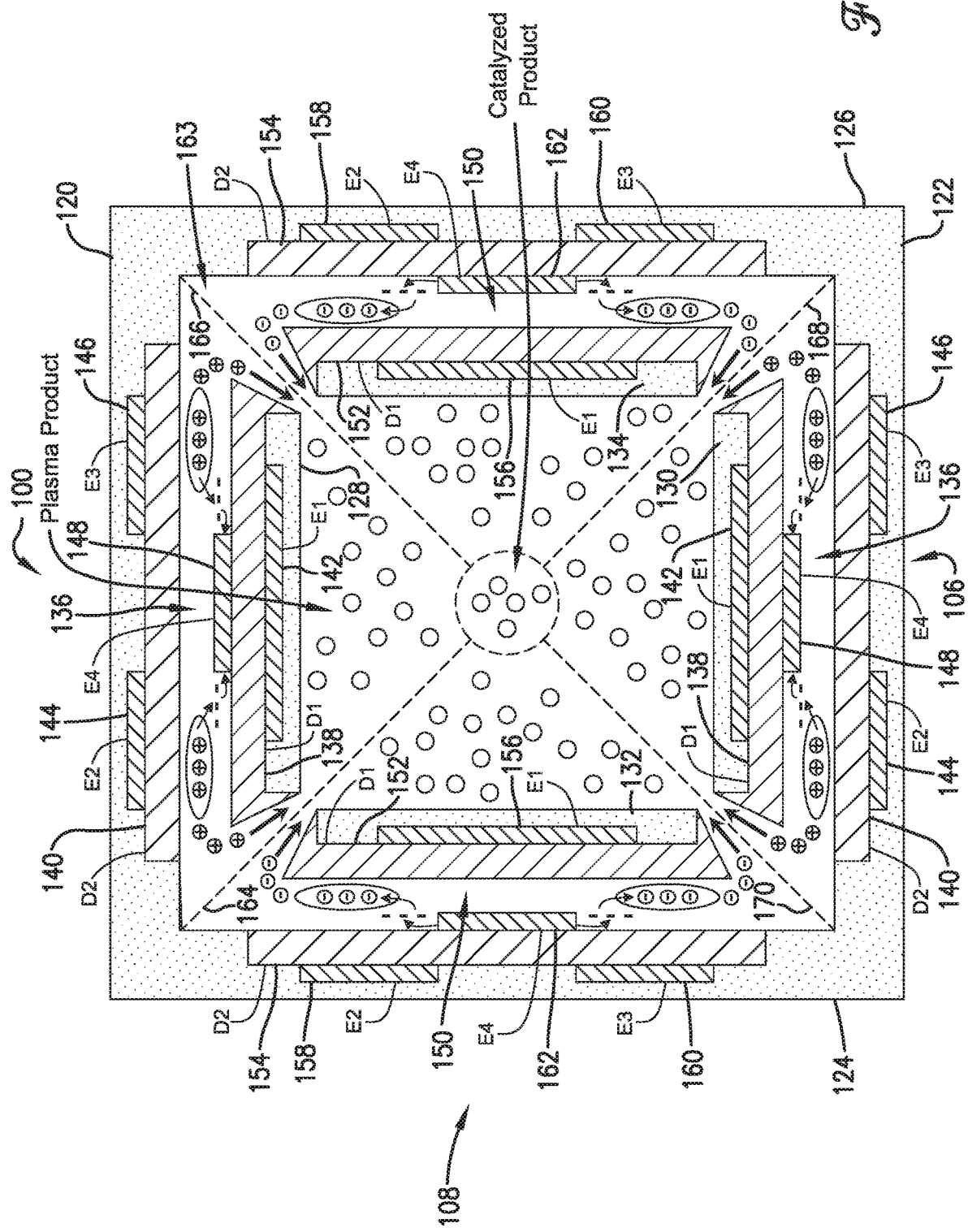

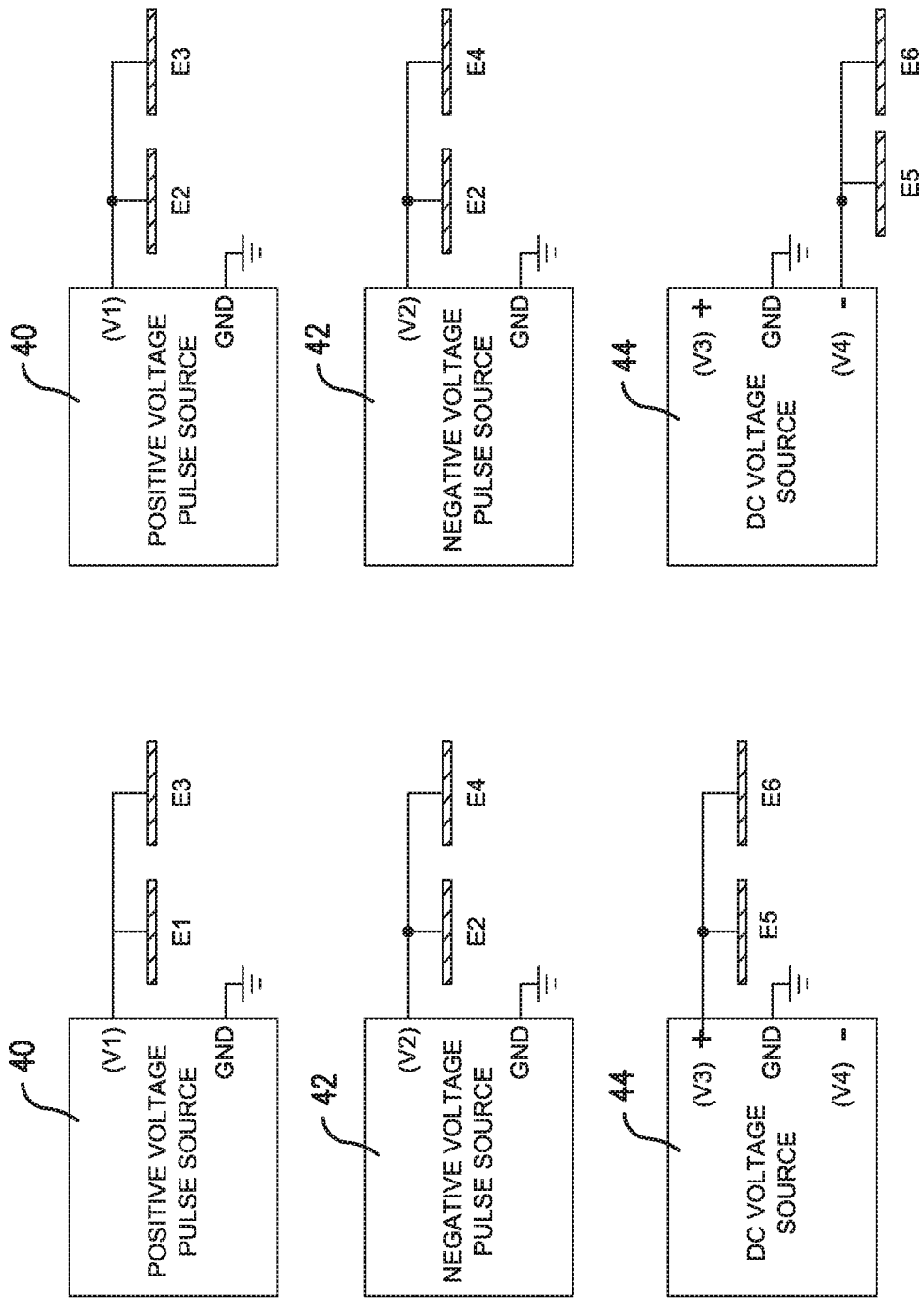

NON-THERMAL MULTIPLE PLASMA GATE DEVICES

RELATED APPLICATION

The current patent application is a non-provisional patent application which claims priority benefit to U.S. Provisional Application No. 62/756,893, entitled "NON-THERMAL PLASMA GATE DEVICE", filed Nov. 7, 2018. The provisional application is hereby incorporated by reference, in its entirety, into the current patent application.

FIELD OF THE INVENTION

Embodiments of the current invention relate to plasma gate devices.

DESCRIPTION OF THE RELATED ART

A plasma gate device receives a source gas or liquid to be converted to a plasma and mixed with another gas or liquid. The plasma gate device includes an electric field generator which generates an electric field through which one of the fluids flows. Exposure to the electric field creates a plasma with a cloud of electrons that can be manipulated. The plasma generated by the plasma gate device may be directed to the other fluid for simple applications such as nitrogen enrichment of water, purification of water, and so forth. However, the plasma gate device lacks the ability to perform more sophisticated operations.

SUMMARY OF THE INVENTION

Embodiments of the current invention offer an advance in the art of plasma gate devices by providing a device with multiple plasma gates. The multi plasma gate device of the current invention is capable of receiving a plurality of fluids, each of which can be energized into a plasma and have its electrons manipulated to create either positive plasma ions or negative plasma ions. The plasma ions of one polarity may bond with the plasma ions of the opposite polarity to create plasma product. This ability allows the multi plasma gate device to perform a type of electrochemical synthesis in which complex multi-element molecules or compounds can be created using electronics instead of traditional laboratory based methods and procedures.

The multi plasma gate device comprises a plasma creation chamber, a first dielectric, a second dielectric, a third dielectric, a fourth dielectric, a first electrode, a second electrode, a third electrode, a fourth electrode, a fifth electrode, and a sixth electrode. The plasma creation chamber includes a space in which plasma is created. The plasma creation is configured to receive a first fluid and a second fluid. The first dielectric forms a first portion of an upper boundary of the plasma creation chamber. The second dielectric forms a first portion of a lower boundary of the plasma creation chamber. The third dielectric forms a second portion of the upper boundary of the plasma creation chamber. The fourth dielectric forms a second portion of the lower boundary of the plasma creation chamber. Each dielectric includes an inner surface facing the plasma creation chamber and an outer surface facing away from the plasma creation chamber.

The first electrode is in contact with the outer surface of the first dielectric, and the second electrode is in contact with the outer surface of the second dielectric. The first electrode is configured to receive a first electric voltage, and the second electrode is configured to receive a second electric voltage. The first and second electric voltages in combination generate a first electric field in the plasma creation chamber through which the first fluid flows creating a first plasma. The third electrode is in contact with the outer surface of the third dielectric, and the fourth electrode is in contact with the outer surface of the fourth dielectric. The third electrode is configured to receive the first electric voltage, and the fourth electrode is configured to receive the second electric voltage. The first and second electric voltages in combination generate a second electric field in the plasma creation chamber through which the second fluid flows creating a second plasma.

The fifth electrode is at least partially exposed to the plasma creation chamber and is configured to receive a third electric voltage to manipulate electrons in the first plasma and create plasma ions with a first polarity. The sixth electrode is at least partially exposed to the plasma creation chamber. The sixth electrode is configured to receive a fourth electric voltage to manipulate electrons in the second plasma and create plasma ions with a second polarity, such that plasma ions with the first polarity bond with plasma ions of the second polarity.

Another embodiment of the current invention provides a multi plasma gate device comprising a housing, first and second positive ion dual plasma gate devices, first and second negative ion dual plasma gate devices, and a plasma product chamber. The housing includes four side walls connected to one another and has a quadrilateral cross section.

The first positive ion dual plasma gate device is positioned along a first side wall, and the second positive ion dual plasma gate device is positioned along a second side wall opposite the first side wall. Each positive ion dual plasma gate device includes a plasma creation chamber, first and second electric field generators, and a bias electrode. The plasma creation chamber is configured to receive a first fluid. The first electric field generator is positioned on a first side of the plasma creation chamber and is configured to generate a first electric field. The second electric field generator is positioned on a second side of the plasma creation chamber and is configured to generate a second electric field. The first electric field and the second electric field energize the first fluid to create a first plasma. The bias electrode is at least partially exposed to the plasma creation chamber and is configured to receive a first bias electric voltage to extract electrons from the first plasma and create positive plasma ions.

The first negative ion dual plasma gate device is positioned along a third side wall, and the second negative ion dual plasma gate device is positioned along a fourth side wall opposite the third side wall. Each negative ion dual plasma gate device includes a plasma creation chamber, first and second electric field generators, and a bias electrode. The plasma creation chamber is configured to receive a second fluid. The first electric field generator is positioned on a first side of the plasma creation chamber and is configured to generate a third electric field. The second electric field generator is positioned on a second side of the plasma creation chamber and is configured to generate a fourth electric field. The third electric field and the fourth electric field energize the second fluid to create a second plasma. The bias electrode is at least partially exposed to the plasma creation chamber and is configured to receive a second bias electric voltage to inject electrons into the second plasma and create positive plasma ions.

The plasma product chamber is configured to receive the positive plasma ions and the negative plasma ions so that at least a portion of the positive plasma ions bond with at least a portion of the negative plasma ions to create a plasma product.

Yet another embodiment of the current invention provides a multi plasma gate device comprising a housing, a plurality of single plasma gate devices, and a plasma product chamber. Each single plasma gate device is configured to create a plasma and includes a plasma creation chamber, first and second dielectrics, first and second electrodes, and a bias electrode. The plasma creation chamber includes a first end opening and an opposing second end opening. The first end opening is configured to receive a fluid. The first dielectric forms a first boundary of the plasma creation chamber, and the second dielectric forms an opposing second boundary of the plasma creation chamber. Each dielectric includes an inner surface facing the plasma creation chamber and an outer surface facing away from the plasma creation chamber. The first electrode is in contact with the outer surface of the first dielectric, and the second electrode is in contact with the outer surface of the second dielectric. The first electrode is configured to receive a first electric voltage, and the second electrode configured to receive a second electric voltage. The first and second electric voltages in combination generate an electric field in the plasma creation chamber through which the fluid flows creating the plasma. The plasma product chamber is positioned in the center of the housing and is configured to receive the plasma ions from each single plasma gate device. Within the plasma product chamber, at least a portion of the plasma ions having the first polarity bond with at least a portion of the plasma ions having the second polarity to create a plasma product.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein:

FIG. 9 is a schematic block diagram of the multi plasma gate device of FIG. 5 including an optional catalytic membrane;

FIG. 13 is a schematic block diagram of a plurality of electric voltage sources configured to supply electric voltage to the positive ion dual plasma gate devices;

FIG. 14 is a schematic block diagram of a plurality of electric voltage sources configured to supply electric voltage to the negative ion dual plasma gate devices.

Figure 1:
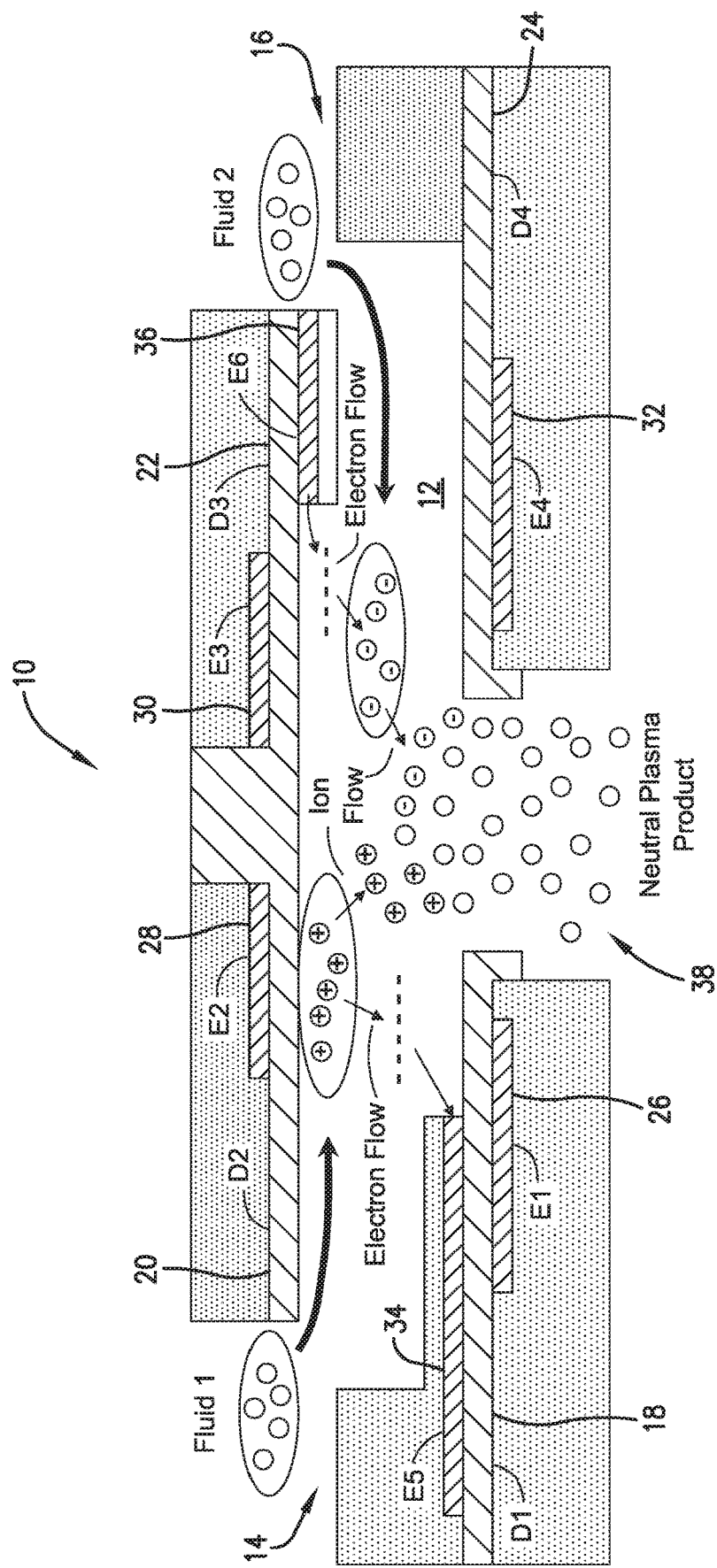
FIG. 1 is a schematic block diagram of a multi plasma gate device, constructed in accordance with at least one embodiment of the current invention, the multi plasma gate device broadly comprising a plasma creation chamber, a plurality of dielectrics, and a plurality of electrodes.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

A multi plasma gate device 10, constructed in accordance with at least one embodiment of the current invention, is shown in FIG. 1. The multi plasma gate device 10 may be utilized to provide small-scale, point-of-use synthesis of compounds that would otherwise require complex processing and catalytic assistance. The multi plasma gate device 10 is retained within a housing (not shown in the figures) which includes a plurality of ports, with each port coupling to a fluid inlet or a fluid outlet. The housing further includes a plurality of electrical connectors, with each electrical connector configured to couple to an electrical cable that connects to at least one of a plurality of voltage sources. Each electrical connector also electrically connects to one or more electrodes of the multi plasma gate device 10, as discussed in more detail below. The housing also includes a plurality of electrically insulating structures in which, or on which, the electrode and dielectric components of the multi plasma gate device 10 are positioned. The multi plasma gate device 10 broadly comprises a plasma creation chamber 12, a first fluid inlet 14, a second fluid inlet 16, first through fourth dielectrics 18, 20, 22, 24, first through sixth electrodes 26, 28, 30, 32, 34, 36, and a fluid outlet 38.

The terms "upstream" and "downstream" may be used hereinafter to describe relative directions or positionings with regard to the flow of fluids (gases and/or liquids) and plasma utilized or produced by the multi plasma gate device 10 and other devices described herein. Upstream generally refers to a direction opposing the flow, while downstream generally refers to a direction coinciding with, or corresponding to, the flow. In addition, relational terms such as "upper", "lower", "outer", "inner", "left", "right", etc. may be used with their traditional meanings to describe relative positionings of various components of the invention. The terms may be used in reference to the figures and the orientations of components therein. The components may be oriented in other ways and thus, the terms do not limit the scope of the claimed invention.

The plasma creation chamber 12 is a space in which plasma is created by applying one or more electric fields to the source fluids. The plasma creation chamber 12 is positioned within the housing in between spaced-apart electrically insulating structures.

The first fluid inlet 14 provides a first fluid into the plasma creation chamber 12. The first fluid inlet 14 receives the first fluid from an external source through one of the housing ports. The first fluid inlet 14 is positioned at the upper left portion of the plasma creation chamber 12.

The second fluid inlet 16 provides a second fluid into the plasma creation chamber 12. The second fluid inlet 16 receives the second fluid from an external source through one of the housing ports. The second fluid inlet 16 is positioned at the upper right portion of the plasma creation chamber 12.

Each of the dielectrics 18, 20, 22, 24 are formed from non-conductive materials, such as plastics, ceramics, or other dielectric materials, with a high dielectric strength and a high electrical permittivity. Each of the dielectrics 18, 20, 22, 24 has a generally L-shaped cross section with an elongated first portion having a thin rectangular cross section and a shorter second portion oriented transverse to the first portion. The first portion of each of the dielectrics 18, 20, 22, 24 further includes a upper surface and an opposing lower surface. The first dielectric 18 is positioned in the lower left region of the plasma creation chamber 12 with at least a portion of its upper surface exposed to the plasma creation chamber 12. The second dielectric 20 is positioned in the upper left region of the plasma creation chamber 12 with at least a portion of its lower surface exposed to the plasma creation chamber 12. The third dielectric 22 is positioned in the upper right region of the plasma creation chamber 12 with at least a portion of its lower surface exposed to the plasma creation chamber 12. In various embodiments, the second dielectric 20 and the third dielectric 22 may be formed as a single, monolithic dielectric component. The fourth dielectric 24 is positioned in the lower right region of the plasma creation chamber 12 with at least a portion of its upper surface exposed to the plasma creation chamber 12. At least a portion of the first dielectric 18 and at least a portion of the fourth dielectric 24 may define at least a portion of a lower boundary of the plasma creation chamber 12. At least a portion of the second dielectric 20 and at least a portion of the third dielectric 22 may define at least a portion of an upper boundary of the plasma creation chamber 12.

Each of the electrodes 26, 28, 30, 32, 34, 36 are formed from electrically conductive material including metals such as copper, gold, silver, aluminum, nickel, or the like, or alloys thereof. The first electrode 26 is positioned in contact with a portion of the lower surface of the first dielectric 18. The second electrode 28 is positioned in contact with a portion of the upper surface of the second dielectric 20. The third electrode 30 is positioned in contact with a portion of the upper surface of the third dielectric 22. The fourth electrode 32 is positioned in contact with a portion of the lower surface of the fourth dielectric 24. A portion of the first electrode 26 is aligned across the plasma creation chamber 12 with a portion of the second electrode 28. A portion of the third electrode 30 is aligned across the plasma creation chamber 12 with a portion of the fourth electrode 32. In addition, the first electrode 26 is electrically connected to the third electrode 30, and the second electrode 28 is electrically connected to the fourth electrode 32.

The fifth electrode 34 is positioned in contact with the upper surface of the first dielectric 18 such that a portion of the fifth electrode 34 overlaps a portion of the first electrode 26 across the first dielectric 18. A section of electrically insulating material covers an upper surface of the fifth electrode 34 such that a right edge of the fifth electrode 34 is exposed to the plasma creation chamber 12. The sixth electrode 36 is positioned in contact with the lower surface of the second dielectric 20. A section of electrically insulating material covers a lower surface of the sixth electrode 36 such that a left edge of the sixth electrode 36 is exposed to the plasma creation chamber 12.

The fluid outlet 38 allows an effluent and/or a plasma product to exit the plasma creation chamber 12. The fluid outlet 38 is positioned in a lower region of the plasma creation chamber 12 between the first dielectric 18 and the fourth dielectric 24.

The multi plasma gate device 10 may be considered a "dual plasma gate device" with the first dielectric 18, the second dielectric 20, the first electrode 26, the second electrode 28, and the fifth electrode 34 forming a first plasma gate device and the third dielectric 22, the fourth dielectric 24, the third electrode 30, the fourth electrode 32, and the sixth electrode 36 forming a second plasma gate device.

Figure 2:
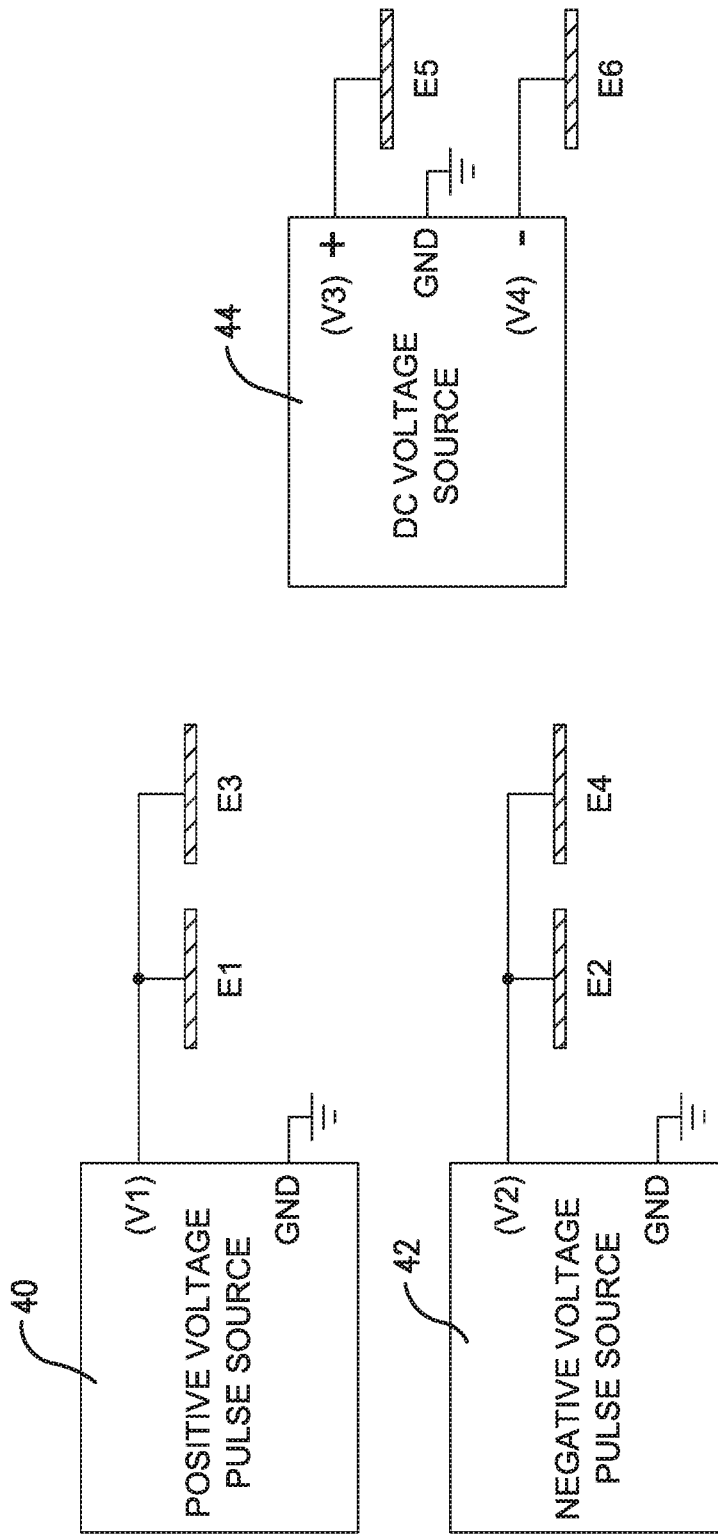
FIG. 2 is a schematic block diagram of a plurality of electric voltage sources configured to supply electric voltage to the multi plasma gate device.
Figure 3:
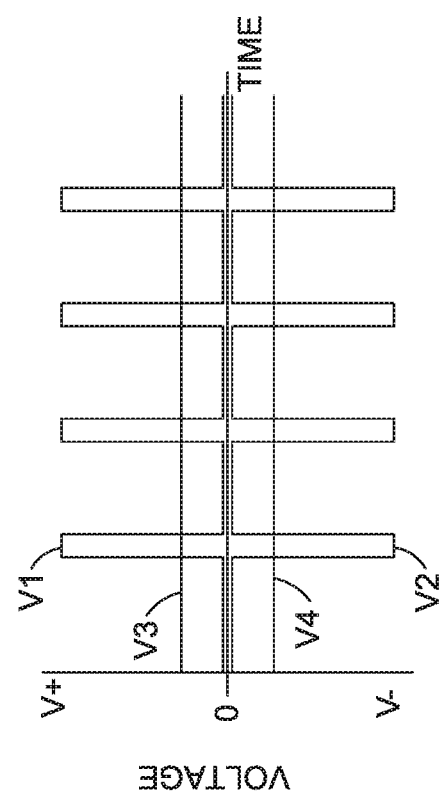
FIG. 3 is a plot of electric voltage vs time for the electric voltages supplied by the electric voltage sources of FIG. 2.

Various electric voltage sources, as shown in FIG. 2, may be utilized with the multi plasma gate device 10. The electric voltage sources may be part of the present invention or they may be external to the present invention. A positive voltage pulse source 40 is configured to supply, through a first port, a first electric voltage (V1) which includes a series of positive electric voltage and/or electric current pulses with respect to a ground level. As shown in FIG. 3, each electric voltage and/or electric current pulse may have a pulse width on the order of approximately 100 nanoseconds (ns) and may be generated every approximately 200 ns to approximately 1 millisecond (ms)—yielding a pulse frequency of approximately 1 kilohertz (kHz) to approximately 5 MHz. Between each positive voltage pulse, the first electric voltage V1 may return to approximately zero volts. The positive voltage pulse source 40 is electrically connected to the first electrode 26 and the third electrode 30.

A negative voltage pulse source 42 is configured to supply, through a first port, a second electric voltage (V2) which includes a series of negative electric voltage and/or electric current pulses with respect to a ground level. As shown in FIG. 3, each electric voltage and/or electric current pulse may have a pulse width on the order of approximately 100 nanoseconds (ns) and may be generated every approximately 200 ns to approximately 1 millisecond (ms)—yielding a pulse frequency of approximately 1 kilohertz (kHz) to approximately 5 MHz. Between each negative voltage pulse, the second electric voltage V2 may return to approximately zero volts. The negative voltage pulses may be roughly synchronous with the positive voltage pulses such that each negative voltage pulse occurs at roughly the same time as a successive one of the positive voltage pulses. The negative voltage pulse source 42 is electrically connected to the second electrode 28 and the fourth electrode 32.

A direct current (DC) voltage source 44 is configured to supply, through a first port, a third electric voltage (V3), which includes a positive DC electric voltage with respect to a ground level and, through a second port, a fourth electric voltage (V4), which includes a negative DC electric voltage with respect to a ground level. As shown in FIG. 3, voltage V3 remains a positive DC voltage over time, while voltage V4 remains a negative DC voltage over time. The positive DC voltage V3 is electrically connected to the fifth electrode 34. The negative DC voltage V4 is electrically connected to the sixth electrode 36.

In various embodiments, the positive voltage pulse source 40, the negative voltage pulse source 42, and the DC voltage source 44 may be provided by a single electric voltage supply unit, such as the one described in U.S. Pat. No. 10,411,481, entitled "Device and Method for Generating a High Voltage Pulse", and issued Sep. 10, 2019. The cited patent is hereby incorporated by reference in its entirety in the current document.

In some embodiments not shown in the figures, the third electrode 30 may not be electrically connected to the first port of the positive voltage pulse source 40. Instead, the positive voltage pulse source 40 may include a second port to which the third electrode 30 is electrically connected. The second port may supply an alternative first electric voltage V1A, which includes roughly the same series of positive voltage pulses as the first electric voltage V1. However, the pulses of the alternative first electric voltage V1A may be time delayed, or phase shifted, with respect to the pulses of the first electric voltage V1. In addition, the fourth electrode 32 may not be electrically connected to the first port of the negative voltage pulse source 42. Instead, the negative voltage pulse source 42 may include a second port to which the fourth electrode 32 is electrically connected. The second port may supply an alternative second electric voltage V2A, which includes roughly the same series of positive voltage pulses as the second electric voltage V2. However, the pulses of the alternative second electric voltage V2A may be time delayed, or phase shifted, with respect to the pulses of the second electric voltage V2.

The multi plasma gate device 10 may operate as follows. Source fluids, including gases such as hydrogen gas or nitrogen gas, or liquids such as water, are supplied to the fluid ports on the housing. A first fluid flows through the first fluid inlet 14 into the plasma creation chamber 12. And, a second fluid flows through the second fluid inlet 16 into the plasma creation chamber 12. The fluids may be supplied with a positive pressure or they may be supplied at standard atmospheric pressure.

Referring to FIG. 1, with the first fluid in position between the first electrode 26 and the second electrode 28, the positive voltage pulse of voltage V1 is applied to the first electrode 26 and the negative voltage pulse of voltage V2 is applied to the second electrode 28. The application of the two voltage pulses creates a high-strength first electric field between the first electrode 26 and the second electrode 28. The electric field energizes, or charges, the first fluid which creates a first plasma (cloud). The first plasma is in a state in which charge is separated and electrons may be either extracted from, or injected into, the constituents (atoms or molecules) of the first plasma. The positive DC voltage of the third electric voltage V3 applied to the fifth electrode 34 attracts at least some electrons from the constituents of the first plasma, which provides electron extraction, indicated as "Electron Flow" in the left side of FIG. 1. The electron extraction results in at least a portion of the first plasma constituents becoming positive ions. After the two voltage pulses subside and the first electric field no longer exists, the positive ions are in the presence of the positive DC voltage from the fifth electrode 34. The positive ions experience a force of repulsion coming from the left side of the plasma creation chamber 12 and migrate toward the center of the plasma creation chamber 12, indicated as "Ion Flow" in the center of FIG. 1.

A similar process occurs for the second fluid as occurred for the first fluid, described above. With the second fluid in position between the third electrode 30 and the fourth electrode 32, the positive voltage pulse of voltage V1 is applied to the third electrode 30 and the negative voltage pulse of voltage V2 is applied to the fourth electrode 32. The voltage pulses applied to the third electrode 30 and the fourth electrode 32 may be applied at the same time, or at a different time (with the same frequency, but phase shifted), as the voltage pulses applied to the first electrode 26 and the second electrode 28. The application of the two voltage pulses creates a high-strength second electric field between the third electrode 30 and the fourth electrode 32. The electric field energizes, or charges, the second fluid which creates a second plasma (cloud). The second plasma is in a state in which charge is separated and electrons may be either extracted from, or injected into, the constituents (atoms or molecules) of the second plasma. The negative DC voltage of the fourth electric voltage V4 applied to the sixth electrode 36 injects electrons into at least some the constituents of the second plasma, which provides electron injection, indicated as "Electron Flow" in the right side of FIG. 1. The electron injection results in at least a portion of the second plasma constituents becoming negative ions. After the two voltage pulses subside and the second electric field no longer exists, the negative ions are in the presence of the negative DC voltage from the sixth electrode 36. The negative ions experience a force of repulsion coming from the right side of the plasma creation chamber 12 and migrate toward the center of the plasma creation chamber 12, indicated as "Ion Flow" in the center of FIG. 1.

The positive ions from the first plasma and the negative ions from the second plasma meet in or near the center of the plasma creation chamber 12 and are attracted to one another. One or more positive ions may bond with one or more negative ions and create a neutral plasma product, which exits the plasma creation chamber 12 into the fluid outlet 38.

The processes described above, in which a positive voltage pulse is applied to the first electrode 26 and the third electrode 30 and a negative voltage pulse is applied the second electrode 28 and the fourth electrode 32 to generate the first plasma and the second plasma, may be repeated indefinitely. The pulsing of voltage to the first through fourth electrodes 26, 28, 30, 32 steadily creates the first plasma and the second plasma. The constant DC voltages applied to the fifth electrode 34 and the sixth electrode 36, in a first instance, steadily creates ions in the plasma and, in a second instance, steadily forces the ions from the two plasmas toward one another.

In an exemplary implementation of the multi plasma gate device 10, the first fluid may include hydrogen gas, and the second fluid may include nitrogen gas. The first plasma may include H or H+ radicals (protons), while the second plasma may include $N_2{''}^-$ anion or $N_2^-$ or $N_3^-$ radical gas phase nitride ions, or other appropriate intermediate nitrogen containing ions. The product formed from the bonding of the two ions may include anhydrous ammonia ($NH_3$).

In another embodiment, the multi plasma gate device 100 is shown in FIGS. 4-7 and broadly comprises a housing 102, first and second positive ion dual plasma gate devices 104, 106, first and second negative ion dual plasma gate devices 108, 110, and a plasma product chamber 112.

Figure 4:
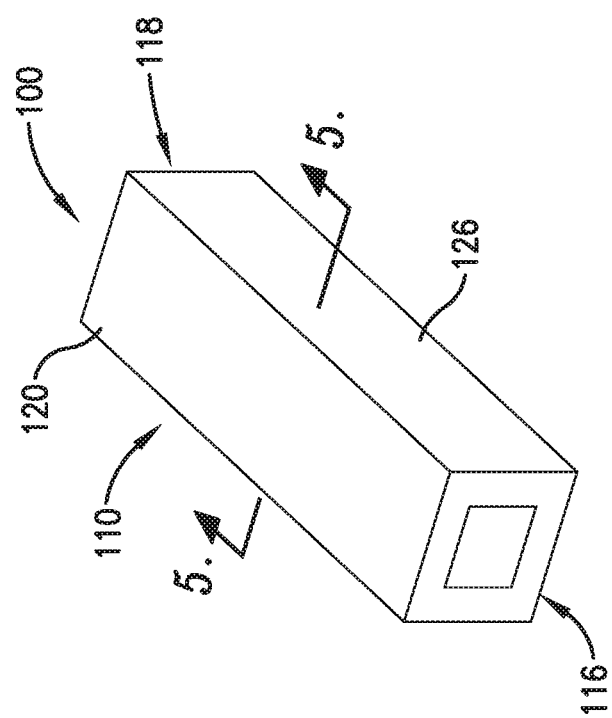
FIG. 4 is a perspective view of a multi plasma gate device according to other embodiments of the current invention.
Figure 5:
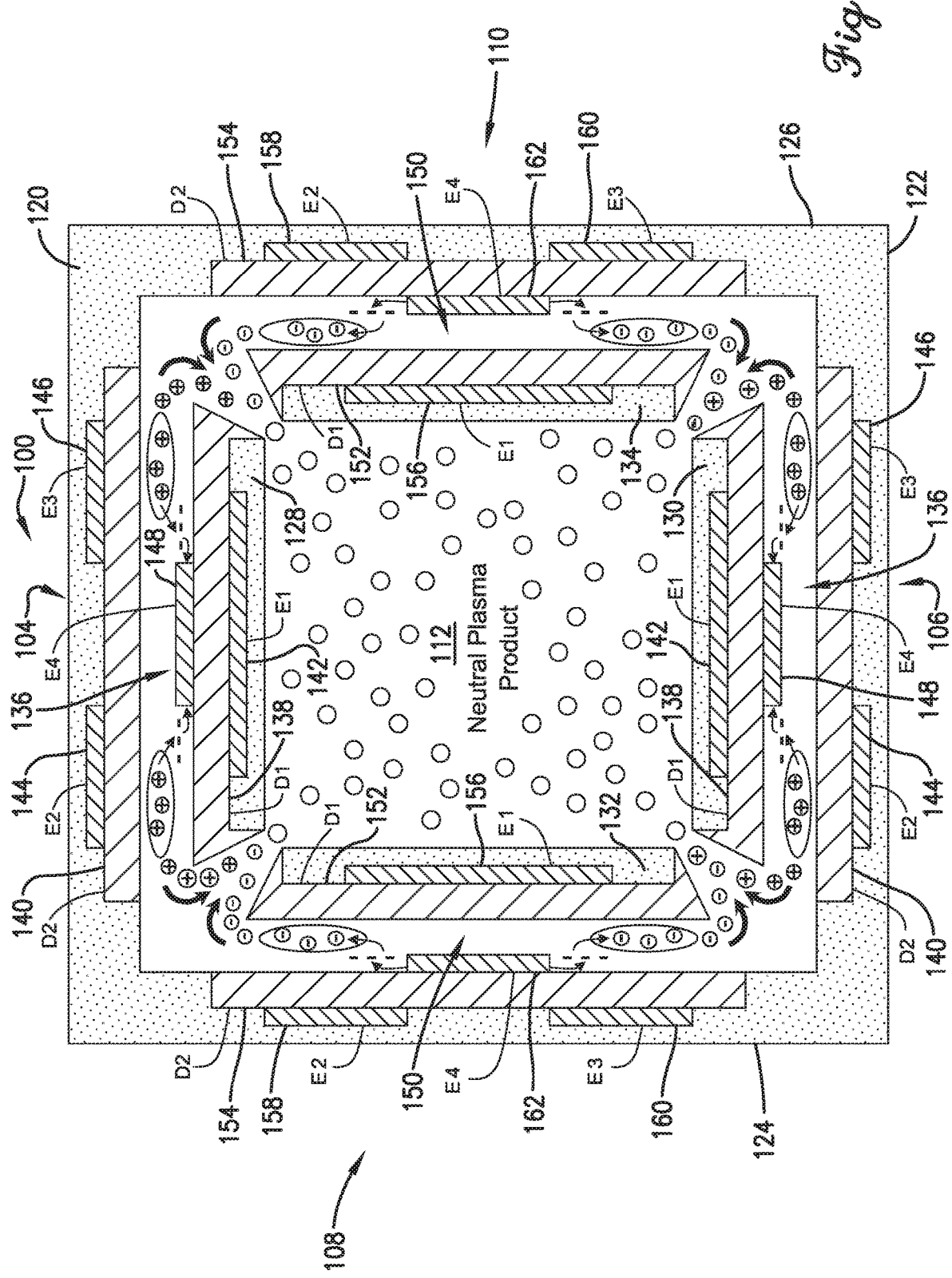
FIG. 5 is a schematic block diagram representing a sectional view of the multi plasma gate device cut along the line 5-5 of FIG. 4, the multi plasma gate device including first and second positive ion dual plasma gate devices, first and second negative ion dual plasma gate devices, and a plasma product chamber.

Referring to FIG. 4, the housing 102 retains the other components of the multi plasma gate device 100 and has first and second end walls 116, 118 and first through fourth exterior (side) walls 120, 122, 124, 126 connected to one another to form a generally elongated box with a central longitudinal axis. Each of the exterior walls 120, 122, 124, 126 has an outer surface facing the exterior of the housing 102 and an inner surface facing the center of the housing 102. The first exterior wall 120 may be positioned along a top side of the housing 102. The second exterior wall 122 may be positioned along a bottom side of the housing 102. The third exterior wall 124 may be positioned along a left side of the housing 102. The fourth exterior wall 126 may be positioned along a right side of the housing 102. As shown in FIG. 5, the housing 102 further includes first through fourth interior walls 128, 130, 132, 134 positioned within the interior of the housing 102 and oriented to be generally parallel to the respective first through fourth exterior walls 120, 122, 124, 126. Each of the interior walls 128, 130, 132, 134 has an outer surface facing the exterior of the housing 102 and an inner surface facing the center of the housing 102. The interior walls 128, 130, 132, 134 are spaced apart from one another to form one of a plurality of plasma passageways between each adjacent pair of interior walls 128, 130, 132, 134. The interior walls 128, 130, 132, 134 are spaced apart from the exterior walls 120, 122, 124, 126 such that the outer surfaces of the interior walls 128, 130, 132, 134 generally face the inner surfaces of the exterior walls 120, 122, 124, 126.

The first positive ion dual plasma gate device 104 is positioned between the first exterior wall 120 and the first interior wall 128. The second positive ion dual plasma gate device 106 is positioned between the second exterior wall 122 and the second interior wall 130. The first negative ion dual plasma gate device 108 is positioned between the third exterior wall 124 and the third interior wall 132. The second negative ion dual plasma gate device 110 is positioned between the fourth exterior wall 126 and the fourth interior wall 134.

Each positive ion dual plasma gate device 104, 106 includes a plasma creation chamber 136, a first dielectric 138, a second dielectric 140, a first electrode 142, a second electrode 144, a third electrode 146, and a fourth electrode 148. The plasma creation chamber 136 is a space in which plasma is created by applying one or more electric fields to the source fluids. The plasma creation chamber 136 extends along the length or longitudinal axis of the housing 102 and is positioned between one of the exterior walls 120, 122, 124, 126 and one of the interior walls 128, 130, 132, 134.

Each of the dielectrics 138, 140 is formed from non-conductive materials, such as plastics, ceramics, or other dielectric materials, with a high dielectric strength and a high electrical permittivity. Each of the dielectrics 138, 140 has an inner surface, which faces the center of the housing 102, and an outer surface, which faces the exterior of the housing 102. The first dielectric 138 has an elongated rectangular shaped cross section with first and second triangular cross sections at opposing ends of the rectangular section such that triangular sections cover opposing end surfaces of one of the interior walls 128, 130, 132, 134. The second dielectric 140 has an elongated rectangular shaped cross section. The first dielectric 138 is positioned along the outer surface of one of the interior walls 128, 130, 132, 134. The second dielectric 140 is positioned along the inner surface of one of the exterior walls 120, 122, 124, 126. The inner surface of the second dielectric 140 defines at least a portion of an outer boundary of the plasma creation chamber 136.

Each of the electrodes 142, 144, 146, 148 is formed from electrically conductive material including metals such as copper, gold, silver, aluminum, nickel, or the like, or alloys thereof. Referring to FIG. 5, the first electrode 142 is positioned in contact with a portion of the inner surface of the first dielectric 138. In other embodiments, the first electrode 142 may include two physically separated electrodes that electrically connected to one another. The second electrode 144 is positioned in contact with a portion of the outer surface of the second dielectric 140 along a left half thereof. The third electrode 146 is positioned in contact with a portion of the outer surface of the second dielectric 140 along a right half thereof. A first portion of the first electrode 142 is aligned with a portion of the second electrode 144, and a second portion of the first electrode 142 is aligned with a portion of the third electrode 146. The fourth electrode 148 is positioned in contact with a portion of the outer surface of the first dielectric 138 roughly in the center thereof. At least a portion of the fourth electrode 148 is exposed to the plasma creation chamber 136. The outer surface of the first dielectric 138 and the fourth electrode 148 define at least a portion of the inner boundary of the plasma creation chamber 136.

The first dielectric 138, the second dielectric 140, the first electrode 142, and the second electrode 144 form a first electric field generator. The first dielectric 138, the second dielectric 140, the first electrode 142, and the third electrode 146 form a second electric field generator.

Figure 6:
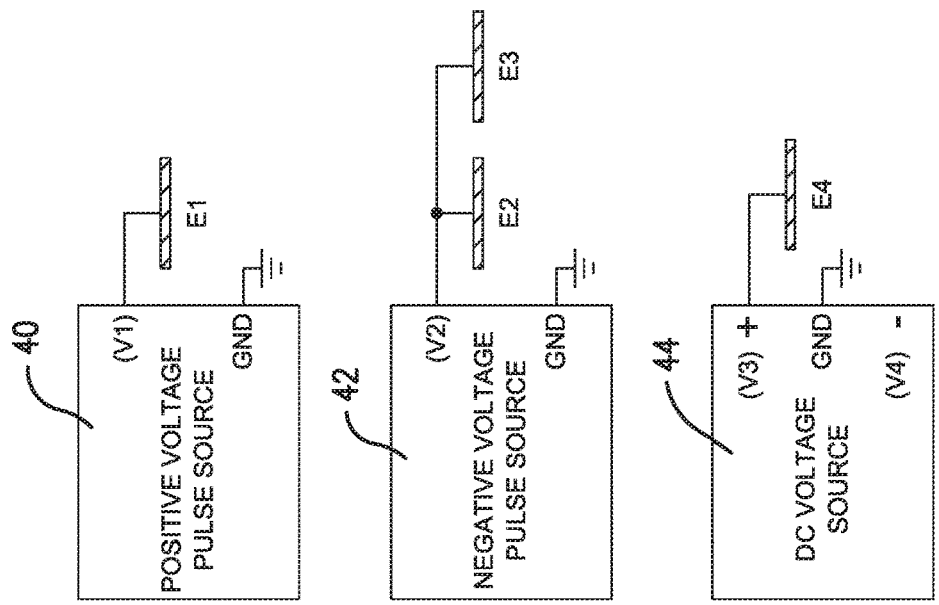
FIG. 6 is a schematic block diagram of a plurality of electric voltage sources configured to supply electric voltage to the positive ion dual plasma gate devices.

Referring to FIGS. 3 and 6, the positive voltage pulse source 40, the negative voltage pulse source 42, and the DC voltage source 44 are utilized with the positive ion dual plasma gate devices 104, 106. The first electrode 142 is electrically connected to the positive voltage pulse source 40 and receives the first electric voltage V1. The second electrode 144 and the third electrode 146 are electrically connected to the negative voltage pulse source 42 and receive the second electric voltage V2. The fourth electrode 148 is electrically connected to the positive voltage port of the DC voltage source 44 and receives the third electric voltage V3, which is a bias voltage. Thus, the fourth electrode 148 may be considered a "bias electrode".

The plasma creation process for the positive ion dual plasma gate devices 104, 106 may occur as follows. The first fluid flows into the plasma creation chamber 136 and is positioned between the first electrode 142 and the second electrode 144 and between the first electrode 142 and the third electrode 146. The positive voltage pulse of voltage V1 is applied to the first electrode 142, and the negative voltage pulse of voltage V2 is applied to the second electrode 144 and the third electrode 146. The application of the two voltage pulses creates a high-strength first electric field between the first electrode 142 and the second electrode 144 and a high-strength second electric field between the first electrode 142 and the third electrode 146. The electric fields energize, or charge, the first fluid in the two locations which creates a first plasma (cloud) and a second plasma (cloud). The first and second plasmas are in a state in which charge is separated and electrons may be either extracted from, or injected into, the constituents (atoms or molecules) of the plasmas. The positive DC voltage of the third electric voltage V3 applied to the fourth electrode 148 attracts at least some electrons from the constituents of the first and second plasmas, which provides electron extraction. The electron extraction results in at least a portion of the first and second plasma constituents becoming positive ions. After the two voltage pulses subside and the first and second electric fields no longer exist, the positive ions are in the presence of the positive DC voltage from the fourth electrode 148. The positive ions experience a force of repulsion coming from the center of the plasma creation chamber 136 and migrate toward the outer edges of the plasma creation chamber 136, where they exit the plasma creation chamber 136 and travel through passageways to the plasma product chamber 112.

Each negative ion dual plasma gate device 108, 110 includes a plasma creation chamber 150, a first dielectric 152, a second dielectric 154, a first electrode 156, a second electrode 158, a third electrode 160, and a fourth electrode 162. Each of these components is structurally similar to the like-named components of the positive ion dual plasma gate device 104, 106 described above—except that fourth electrode 162 is positioned in contact with a portion of the inner surface of the second dielectric 140 roughly in the center thereof.

The first dielectric 152, the second dielectric 154, the first electrode 156, and the second electrode 158 form a first electric field generator. The first dielectric 152, the second dielectric 154, the first electrode 156, and the third electrode 160 form a second electric field generator.

Figure 7:
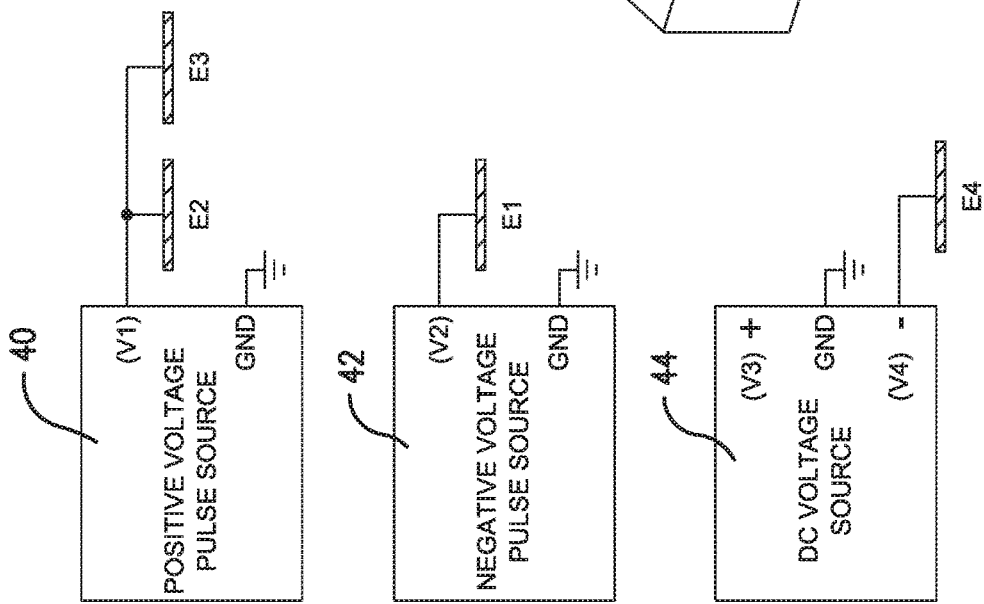
FIG. 7 is a schematic block diagram of a plurality of electric voltage sources configured to supply electric voltage to the negative ion dual plasma gate devices.

Referring to FIG. 7, the positive voltage pulse source 40, the negative voltage pulse source 42, and the DC voltage source 44 are utilized with the negative ion dual plasma gate devices 108, 110. The first electrode 156 is electrically connected to the negative voltage pulse source 42 and receives the second electric voltage V2. The second electrode 158 and the third electrode 160 are electrically connected to the positive voltage pulse source 40 and receive the first electric voltage V1. The fourth electrode 162 is electrically connected to the negative voltage port of the DC voltage source 44 and receives the fourth electric voltage V4, which is a bias voltage. Thus, the fourth electrode 162 may be considered a "bias electrode".

The plasma creation process for the negative ion dual plasma gate devices 108, 110 may occur as follows. The first fluid flows into the plasma creation chamber 150 and is positioned between the first electrode 156 and the second electrode 158 and between the first electrode 156 and the third electrode 160. The negative voltage pulse of voltage V2 is applied to the first electrode 156, and the positive voltage pulse of voltage V1 is applied to the second electrode 158 and the third electrode 160. The application of the two voltage pulses creates a high-strength first electric field between the first electrode 156 and the second electrode 158 and a high-strength second electric field between the first electrode 156 and the third electrode 160. The electric fields energize, or charge, the first fluid in the two locations which creates a first plasma (cloud) and a second plasma (cloud). The first and second plasmas are in a state in which charge is separated and electrons may be either extracted from, or injected into, the constituents (atoms or molecules) of the plasmas. The negative DC voltage of the fourth electric voltage V4 applied to the fourth electrode 162 injects at least some electrons into the constituents of the first and second plasmas, which provides electron injection. The electron injection results in at least a portion of the first and second plasma constituents becoming negative ions. After the two voltage pulses subside and the first and second electric fields no longer exist, the negative ions are in the presence of the negative DC voltage from the fourth electrode 162. The positive ions experience a force of repulsion coming from the center of the plasma creation chamber 150 and migrate toward the outer edges of the plasma creation chamber 150, where they exit the plasma creation chamber 150 and travel through passageways to the plasma product chamber 112.

The plasma product chamber 112 is positioned along the central longitudinal axis of the housing 102 and is bound by the inner surfaces of the interior walls 128, 130, 132, 134. The plasma product chamber 112 provides a space where bonding between the positive plasma ions and the negative plasma ions can occur.

Figure 8:
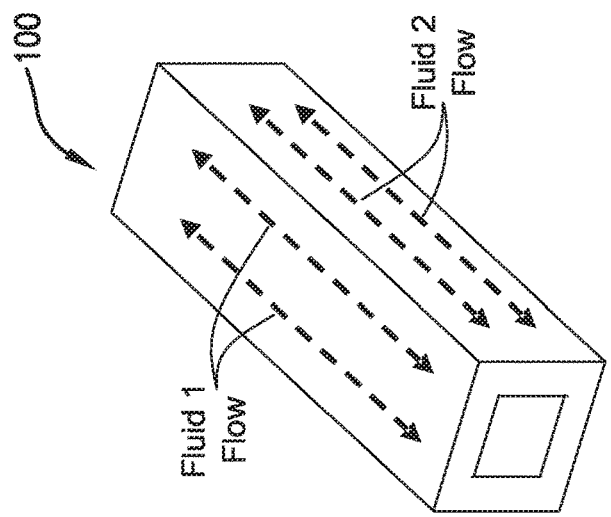
FIG. 8 is a perspective view of the multi plasma gate device depicting flow paths of a first fluid and a second fluid.

The multi plasma gate device 100 may operate as follows. Source fluids, including gases such as hydrogen gas or nitrogen gas, or liquids such as water, are supplied to the housing 102 of the multi plasma gate device 100. The fluids may be received through connectors, ports, and inlets not shown in the figures. The fluids may flow through openings in the exterior walls 120, 122, 124, 126 to be provided to the plasma creation chambers 136, 150. The first fluid may flow lengthwise through the plasma creation chamber 136 of the first positive ion dual plasma gate device 104, as indicated in FIG. 8. The first fluid may also flow lengthwise through the plasma creation chamber 136 of the second positive ion dual plasma gate device 106, which is not shown in the figures. The second fluid may flow lengthwise through the plasma creation chamber 150 of the first negative ion dual plasma gate device 108, which is not shown in the figures. The second fluid may also flow lengthwise through the plasma creation chamber 150 of the second negative ion dual plasma gate device 110, as indicated in FIG. 8. In other embodiments, additional fluids, other than the first and second fluids, may flow through the plasma creation chambers 136, 150 of the second positive ion dual plasma gate device 106 and the second negative ion dual plasma gate device 110. For example, a third fluid may be supplied to and flow through the plasma creation chamber 136 of the second positive ion dual plasma gate device 106, and a fourth fluid may be supplied to and flow through the plasma creation chamber 136 of the second negative ion dual plasma gate device 110.

The plasma creation processes for the positive ion dual plasma gate devices 104, 106 and the negative ion dual plasma gate devices 108, 110 occur as described above. Given that each negative ion dual plasma gate device 108, 110 is positioned adjacent to a positive ion dual plasma gate device 104, 106, and vice-versa, the negative plasma ions have the chance to start bonding with the positive plasma ions as the two types of ions travel through the passageways between the interior walls 128, 130, 132, 134 and into the plasma product chamber 112. At least a portion of the positive ions may bond with at least a portion of the negative ions to create a neutral plasma product. Bonding may continue as the ions and plasma product flow into the plasma product chamber 112. The plasma product may exit the plasma product chamber 112 through one or both of the opposing ends of the housing 102.

The processes described above, in which a positive voltage pulse is applied to first plurality of electrodes and a negative voltage pulse is applied a second plurality of electrodes to generate a plurality of plasmas, may be repeated indefinitely. In some embodiments, the pulses may be applied to each dual plasma gate device 104, 106, 108, 110 at roughly the same time. In other embodiments, each dual plasma gate device 104, 106, 108, 110, or various combinations of the dual plasma gate devices 104, 106, 108, 110, may receive the pulses at the same frequency, but different phases or delay times.

The architecture of the multi plasma gate device 100, with the electric field generating electrode assemblies positioned adjacent to the exterior walls 120, 122, 124, 126, results in lower electromagnetic noise in the plasma product chamber 112, where bonding occurs and the neutral plasma product is created.

Referring to FIG. 9, in various embodiments, the multi plasma gate device 100A may further include a catalytic membrane 163 which enhances the reaction or bonding of the plasma ions produced in the dual plasma gate devices 104, 106, 108, 110. The catalytic membrane 163 includes four side walls 164, 166, 168, 170 that are planar and a central wall 172 that has a hollow cylindrical shape. One edge of each side wall 164, 166, 168, 170 is connected to the central wall 172, such that each side wall 164, 166, 168, 170 extends radially outward from the central wall 172. The side walls 164, 166, 168, 170 are spaced along the circumference of the central wall 172 by an angle of approximately 90 degrees. The catalytic membrane 163 may be formed from a metal composite or a ceramic composite which is porous such that there are a plurality of openings in each side wall 164, 166, 168, 170 and the central wall 172. The openings allow plasma ions to pass through each side wall 164, 166, 168, 170 and the central wall 172. The catalytic membrane 163 is positioned within the housing 102 such that each side wall 164, 166, 168, 170 is located in the passageway between two adjacent interior walls 128, 130, 132, 134, and a longitudinal axis of the central wall 172 is collocated with the longitudinal axis of the housing 102.

In some instances, the plasma ions may leave the dual plasma gate devices 104, 106, 108, 110 and enter the plasma product chamber 112 with a high energy such that bonding between the positive plasma ions and the negative plasma ions occurs at a low rate. The catalytic membrane 163 provides a surface which absorbs the momentum of the positive plasma ions and the negative plasma ions so that the ions can collect and bond with one another—thereby increasing the bonding rate of the plasma ions. During the processes for generating plasma described above, the plasma ions from one dual plasma gate device 104, 106, 108, 110 may travel parallel to a first surface of one of the side walls 164, 166, 168, 170 while the plasma ions from an adjacent dual plasma gate device 104, 106, 108, 110 may travel parallel to an opposing second surface of the same side wall 164, 166, 168, 170. Some plasma ions may travel through the side wall 164, 166, 168, 170 and bond with the opposite charge plasma ions. Other plasma ions may travel to the central wall 172 and either gather to bond with opposite charge plasma ions or pass through to the space surrounded by the central wall 172 and bond with opposite charge plasma ions to form a catalyzed product. Thus, as shown in FIG. 9, the plasma product chamber 112 may include plasma product which has some unbonded plasma ions and some neutral plasma constituents and catalyzed product which has mostly neutral plasma constituents.

Figure 10:
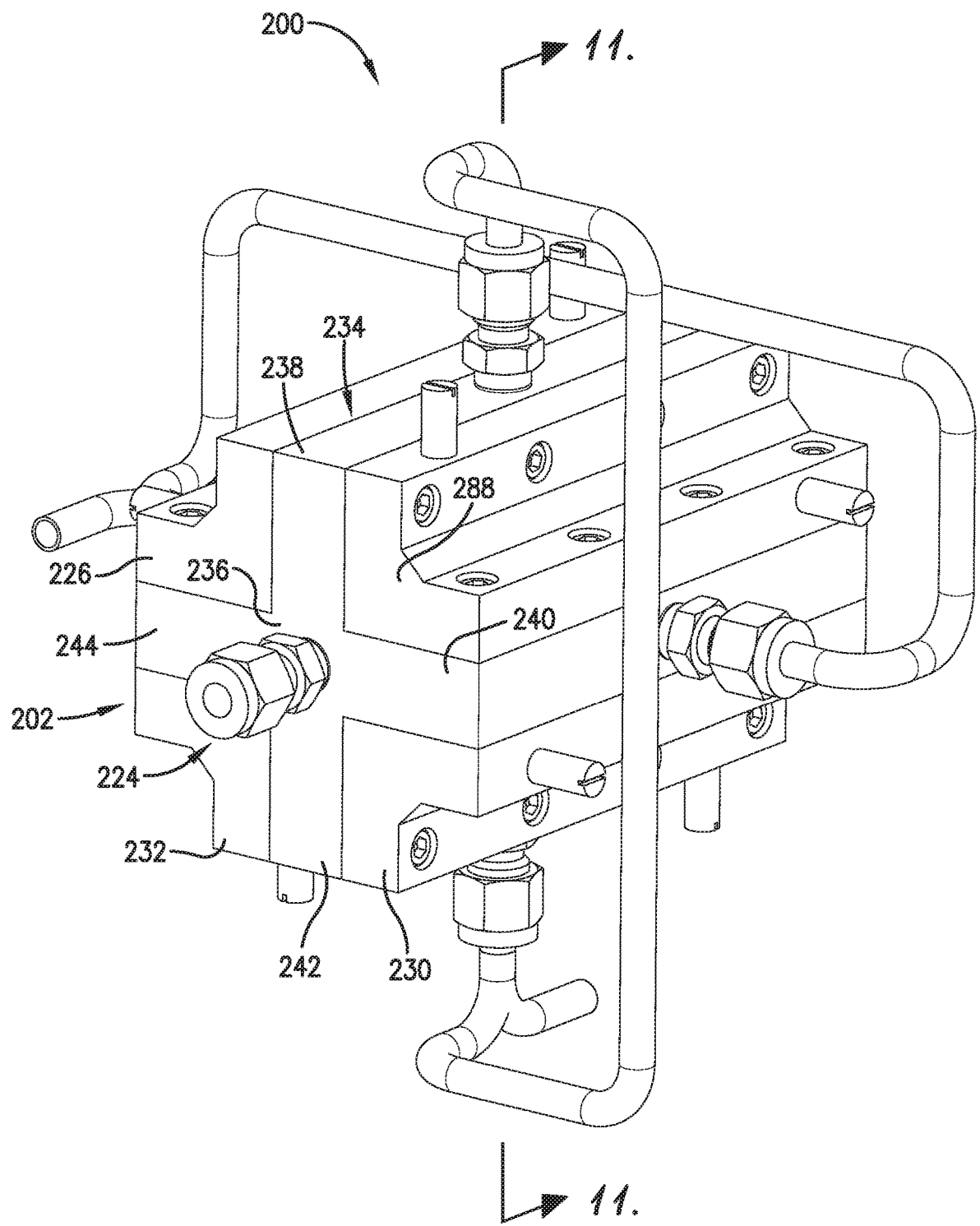
FIG. 10 is a perspective view of a multi plasma gate device according to yet other embodiments of the current invention.
Figure 11:
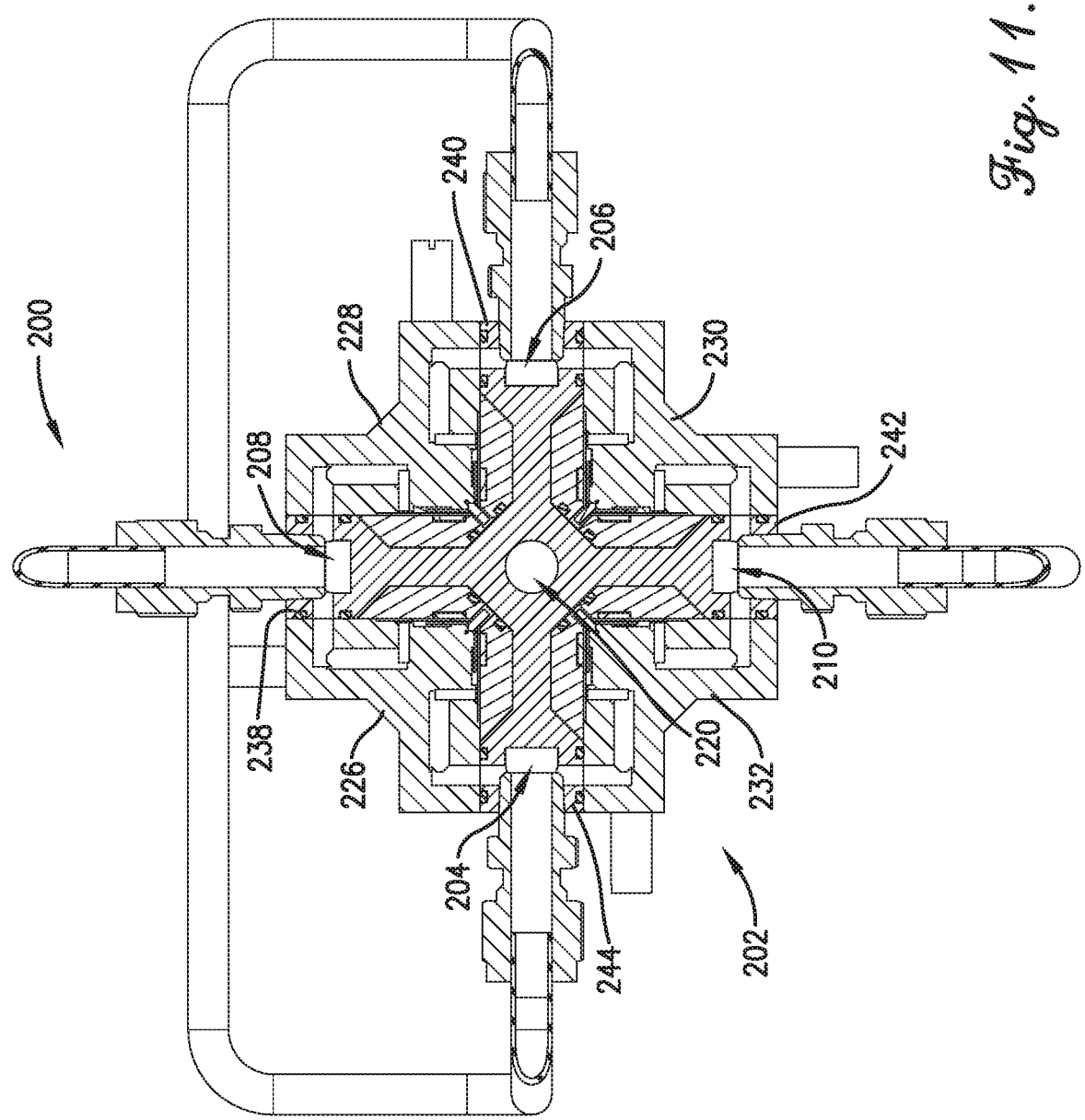
FIG. 11 is a sectional view of the multi plasma gate device cut along the line 11-11 of FIG. 10.
Figure 12:
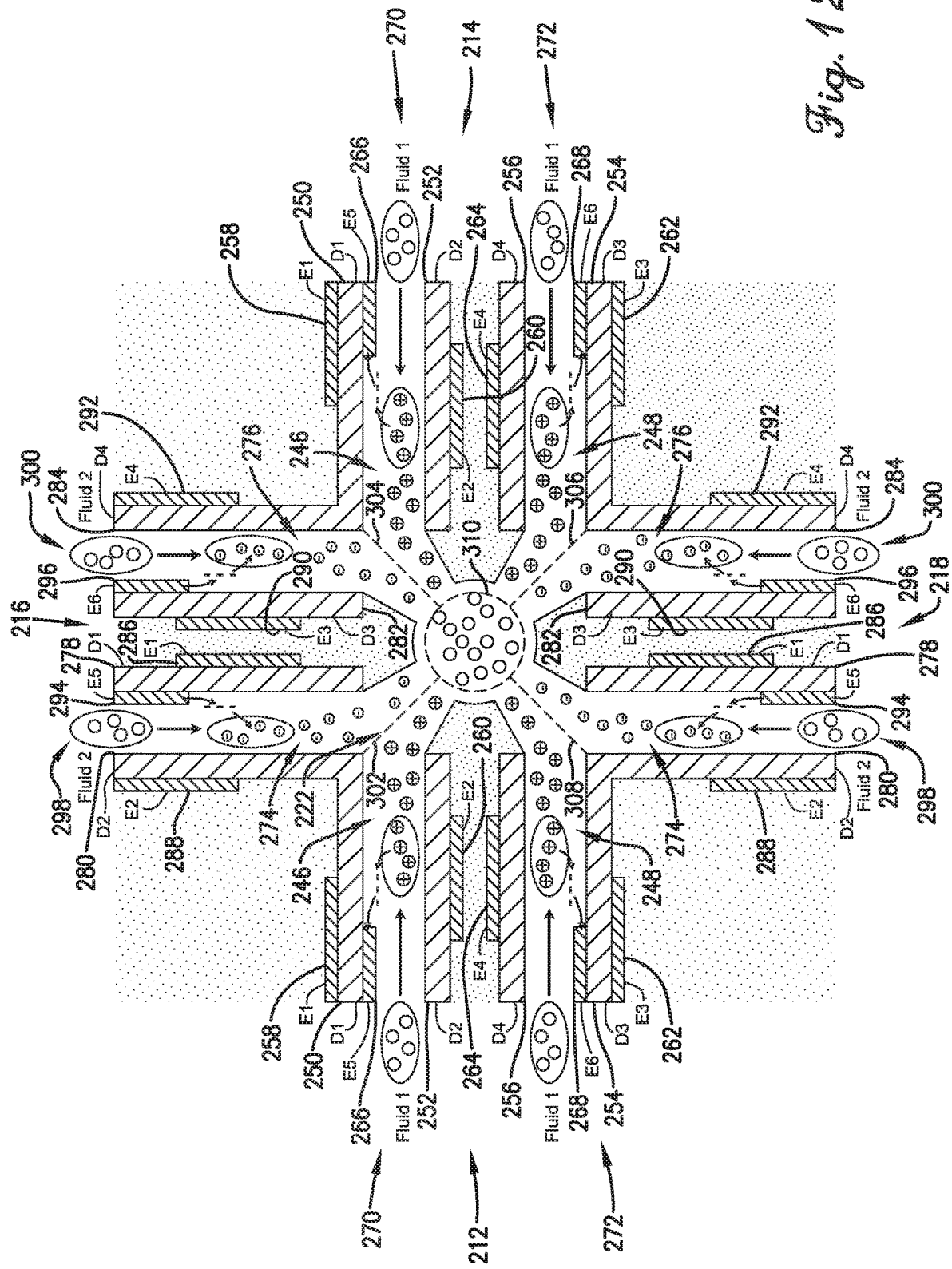
FIG. 12 is a schematic block diagram representing the sectional view of the multi plasma gate device of FIG. 11, the multi plasma gate device including first and second positive ion dual plasma gate devices, first and second negative ion dual plasma gate devices, and a plasma product chamber.

In yet other embodiments, the multi plasma gate device 200 is shown in FIGS. 10-12 and broadly comprises a housing 202, first through fourth fluid inlets 204, 206, 208, 210, first and second positive ion dual plasma gate devices 212, 214, first and second negative ion dual plasma gate devices 216, 218, a plasma product chamber 220, an optional catalytic membrane 222, and a fluid outlet 224.

The housing 202 includes first through fourth quadrant walls 226, 228, 230, 232 and a central block 234. Each quadrant wall 226, 228, 230, 232 includes an elongated first strip and an elongated second strip coupled to one another such that the first strip is oriented in a first direction, such as a vertical direction, and the second strip is oriented in a second direction orthogonal to the first, such as a horizontal direction. Each quadrant wall 226, 228, 230, 232 has a roughly L-shaped cross section with a first end surface and an opposing second end surface. The first quadrant wall 226 is positioned in the upper left of the housing 202. The second quadrant wall 228 is positioned in the upper right of the housing 202. The third quadrant wall 230 is positioned in the lower right of the housing 202. The fourth quadrant wall 232 is positioned in the lower left of the housing 202. The central block 234 includes an elongated core wall 236 and four elongated interior walls 238, 240, 242, 244. Each interior wall 238, 240, 242, 244 is coupled to the core wall 236 such that each interior wall 238, 240, 242, 244 extends radially outward therefrom. Adjacent interior walls 238, 240, 242, 244 are oriented approximately 90 degrees from one another. The central block 234 has a plus sign (+) cross-sectional shape with a first end surface and an opposing second end surface. The quadrant walls 226, 228, 230, 232 are coupled to the central block 234 such that each interior wall 238, 240, 242, 244 is positioned between and coupled to a successive pair of adjacent quadrant walls 226, 228, 230, 232, with the first interior wall 238 being positioned between the first quadrant wall 226 and the second quadrant wall 228, the second interior wall 240 being positioned between the second quadrant wall 228 and the third quadrant wall 230, the third interior wall 242 being positioned between the third quadrant wall 230 and the fourth quadrant wall 232, and the fourth interior wall 244 being positioned between the fourth quadrant wall 232 and the first quadrant wall 226. The core wall 236 of the central block 234 may include an opening along its length, inward from the end surfaces. The opening also creates spaces between adjacent interior walls 238, 240, 242, 244 that form passageways in which plasma ions travel. The housing 202 may further include various couplers, connectors, fittings, adapters, and the like which provide connection to tubes, cables, and/or wiring in order to supply electricity and source fluids to the multi plasma gate device 200.

Each fluid inlet 204, 206, 208, 210 is connected to one of the couplers, etc. that provides one of the fluids from an external source. Each fluid inlet 204, 206, 208, 210 includes a plurality of connected pathways that lead from the coupler to one of the dual plasma gate devices 212, 214, 216, 218. The pathways may extend through one of the quadrant walls 226, 228, 230, 232 and the central block 234. The first fluid inlet 204 provides a fluid to the first positive ion dual plasma gate device 212, the second fluid inlet 206 provides a fluid to the second positive ion dual plasma gate device 214, the third fluid inlet 208 provides a fluid to the first negative ion dual plasma gate device 216, and the fourth fluid inlet 210 provides a fluid to the second negative ion dual plasma gate device 218. In exemplary embodiments, the coupler for the first fluid inlet 204 is connected to the coupler for the second fluid inlet 206 so that the first fluid inlet 204 and the second fluid inlet 206 both provide the same fluid, in this case the first fluid, to the first positive ion dual plasma gate device 212 and the second positive ion dual plasma gate device 214, respectively. Likewise, the coupler for the third fluid inlet 208 is connected to the coupler for the fourth fluid inlet 210 so that the third fluid inlet 208 and the fourth fluid inlet 210 both provide the same fluid, in this case the second fluid, to the first negative ion dual plasma gate device 216 and the second negative ion dual plasma gate device 218, respectively. In alternative embodiments, each fluid inlet 204, 206, 208, 210 may provide one of four different fluids, or various other combinations of fluids, to the dual plasma gate devices 212, 214, 216, 218.

Each positive ion dual plasma gate device 212, 214 extends along the length or longitudinal axis of the housing 202 and includes a first plasma creation chamber 246, a second plasma creation chamber 248, a first dielectric 250, a second dielectric 252, a third dielectric 254, a fourth dielectric 256, a first electrode 258, a second electrode 260, a third electrode 262, a fourth electrode 264, a fifth electrode 266, and a sixth electrode 268.

Each plasma creation chamber 246, 248 is a space in which plasma is created by applying one or more electric fields to the source fluids. Each plasma creation chamber 246, 248 extends along the length or longitudinal axis of the housing 202 and is positioned between one of the quadrant walls 226, 228, 230, 232 and one of the interior walls 238, 240, 242, 244 of the central block 234.

Each of the dielectrics 250, 252, 254, 256 is formed from non-conductive materials, such as plastics, ceramics, or other dielectric materials, with a high dielectric strength and a high electrical permittivity. Each of the dielectrics 250, 252, 254, 256 has an inner surface, which faces toward one of the plasma creation chamber 246, 248, and an outer surface, which faces away from one the plasma creation chambers 246, 248. The first dielectric 250 is positioned in contact with a first one of the quadrant walls 226, 228, 230, 232. The second dielectric 252 is positioned in contact with one of the interior walls 238, 240, 242, 244 of the central block 234. The first dielectric 250 and the second dielectric 252 face one another across the first plasma creation chamber 246. The third dielectric 254 is positioned in contact with a second one of the quadrant walls 226, 228, 230, 232. The fourth dielectric 256 is positioned in contact with the same one of the interior walls 238, 240, 242, 244 of the central block 234 as the second dielectric 252. The third dielectric 254 and the fourth dielectric 256 face one another across the second plasma creation chamber 248.

Each of the electrodes 258, 260, 262, 264, 266, 268 is formed from electrically conductive material including metals such as copper, gold, silver, aluminum, nickel, or the like, or alloys thereof. Referring to FIG. 12, the first electrode 258 is positioned in contact with a portion of the outer surface of the first dielectric 250 at a first end thereof. The second electrode 260 is positioned in contact with a portion of the outer surface of the second dielectric 252 roughly in the center thereof. A portion of the first electrode 258 is aligned with a portion of the second electrode 260. The third electrode 262 is positioned in contact with a portion of the outer surface of the third dielectric 254 at a first end thereof. The fourth electrode 264 is positioned in contact with a portion of the outer surface of the fourth dielectric 256 roughly in the center thereof. A portion of the third electrode 262 is aligned with a portion of the fourth electrode 264. The fifth electrode 266 is positioned in contact with a portion of the inner surface of the first dielectric 250 at the first end thereof. At least a portion of the fifth electrode 266 is exposed to the first plasma creation chamber 246. The sixth electrode 268 is positioned in contact with a portion of the inner surface of the third dielectric 254 at the first end thereof. At least a portion of the sixth electrode 268 is exposed to the second plasma creation chamber 248.

The structure formed by the first plasma creation chamber 246, the first dielectric 250, the second dielectric 252, the first electrode 258, the second electrode 260, and the fifth electrode 266 is a first single plasma gate device 270. The structure formed by the second plasma creation chamber 248, the third dielectric 254, the fourth dielectric 256, the third electrode 262, the fourth electrode 264, and the sixth electrode 268 is a second single plasma gate device 272. The first single plasma gate device 270 is positioned between one of the quadrant walls 226, 228, 230, 232 and one of the interior walls 238, 240, 242, 244. The second single plasma gate device 272 is positioned between an adjacent one of the quadrant walls 226, 228, 230, 232 and the intervening interior walls 238, 240, 242, 244. The second single plasma gate device 272 is oriented to be a mirror image of the first single plasma gate device 270.

The first positive ion dual plasma gate device 212 is positioned between the first quadrant wall 226 and the fourth quadrant wall 232, while the second positive ion dual plasma gate device 214 is positioned between the second quadrant wall 228 and the third quadrant wall 230.

Referring to FIGS. 3 and 13, the positive voltage pulse source 40, the negative voltage pulse source 42, and the DC voltage source 44 are utilized with the positive ion dual plasma gate devices 212, 214. The first electrode 258 and the third electrode 262 are electrically connected to the positive voltage pulse source 40 and receive the first electric voltage V1. The second electrode 260 and the fourth electrode 264 are electrically connected to the negative voltage pulse source 42 and receive the second electric voltage V2. The fifth electrode 266 and the sixth electrode 268 are electrically connected to the positive voltage port of the DC voltage source 44 and receive the third electric voltage V3, which is a bias voltage. Thus, the fifth electrode 266 and the sixth electrode 268 may be considered "bias electrodes".

The plasma creation process for the positive ion dual plasma gate devices 212, 214 may occur as follows. In the first single plasma gate device 270, the first fluid flows into the first plasma creation chamber 246 and is positioned between the first electrode 258 and the second electrode 260. The positive voltage pulse of voltage V1 is applied to the first electrode 258 and the negative voltage pulse of voltage V2 is applied to the second electrode 260. The application of the two voltage pulses creates a high-strength first electric field between the first electrode 258 and the second electrode 260. The electric field energizes, or charges, the first fluid which creates a first plasma (cloud). The first plasma is in a state in which charge is separated and electrons may be either extracted from, or injected into, the constituents (atoms or molecules) of the plasma. The positive DC voltage of the third electric voltage V3 applied to the fifth electrode 266 attracts at least some electrons from the constituents of the first plasma, which provides electron extraction. The electron extraction results in at least a portion of the first plasma constituents becoming positive ions. After the two voltage pulses subside and the first electric field no longer exists, the positive ions are in the presence of the positive DC voltage from the fifth electrode 266. The positive ions experience a force of repulsion coming from an outer edge of the first plasma creation chamber 246 and migrate toward an inner edge of the first plasma creation chamber 246, where they exit the first plasma creation chamber 246 and travel through a passageway to the plasma product chamber 220.

In the second single plasma gate device 272, a substantially similar process occurs at roughly the same time or a different time. The first fluid flows into the second plasma creation chamber 248 and is positioned between the third electrode 262 and the fourth electrode 264. The positive voltage pulse of voltage V1 is applied to the third electrode 262 and the negative voltage pulse of voltage V2 is applied to the fourth electrode 264. The application of the two voltage pulses creates a high-strength second electric field between the third electrode 262 and the fourth electrode 264. The electric field energizes, or charges, the first fluid which creates a second plasma (cloud). The second plasma is in a state in which charge is separated and electrons may be either extracted from, or injected into, the constituents (atoms or molecules) of the plasma. The positive DC voltage of the third electric voltage V3 applied to the sixth electrode 268 attracts at least some electrons from the constituents of the second plasma, which provides electron extraction. The electron extraction results in at least a portion of the second plasma constituents becoming positive ions. After the two voltage pulses subside and the second electric field no longer exists, the positive ions are in the presence of the positive DC voltage from the sixth electrode 268. The positive ions experience a force of repulsion coming from an outer edge of the second plasma creation chamber 248 and migrate toward an inner edge of the second plasma creation chamber 248, where they exit the second plasma creation chamber 248 and travel through a passageway to the plasma product chamber 220.

The processes for plasma creation in the first single plasma gate device 270 and the second single plasma gate device 272 occur in the first positive ion dual plasma gate device 212 and the second positive ion dual plasma gate device 214 at roughly the same time or a different time. In exemplary embodiments, the first positive ion dual plasma gate device 212 and the second positive ion dual plasma gate device 214 may each receive the first fluid. In other embodiments, the first positive ion dual plasma gate device 212 may receive the first fluid, while the second positive ion dual plasma gate device 214 may receive the second fluid or a different fluid.

Each negative ion dual plasma gate device 216, 218 extends along the length or longitudinal axis of the housing 202 and includes a first plasma creation chamber 274, a second plasma creation chamber 276, a first dielectric 278, a second dielectric 280, a third dielectric 282, a fourth dielectric 284, a first electrode 286, a second electrode 288, a third electrode 290, a fourth electrode 292, a fifth electrode 294, a sixth electrode 296, a first single plasma gate device 298, and a second single plasma gate device 300. The structure of the negative ion dual plasma gate devices 216, 218 is similar to the positive ion dual plasma gate devices 212, 214 except that the fifth electrode 294 and the sixth electrode 296 are positioned in different locations from the fifth electrode 266 and the sixth electrode 268, as discussed below.

Each plasma creation chamber 274, 276 extends along the length or longitudinal axis of the housing 202 and is positioned between one of the quadrant walls 226, 228, 230, 232 and one of the interior walls 238, 240, 242, 244 of the central block 234.

Each of the dielectrics 278, 280, 282, 284 has an inner surface, which faces toward one of the plasma creation chambers 274, 276, and an outer surface, which faces away from one the plasma creation chambers 274, 276. The first dielectric 278 is positioned in contact with one of the interior walls 238, 240, 242, 244 of the central block 234. The second dielectric 280 is positioned in contact with a first one of the quadrant walls 226, 228, 230, 232. The first dielectric 278 and the second dielectric 280 face one another across the first plasma creation chamber 246. The third dielectric 282 is positioned in contact with the same one of the interior walls 238, 240, 242, 244 of the central block 234 as the first dielectric 278. The fourth dielectric 284 is positioned in contact with a second one of the quadrant walls 226, 228, 230, 232. The third dielectric 282 and the fourth dielectric 284 face one another across the second plasma creation chamber 276.

Referring to FIG. 12, the first electrode 286 is positioned in contact with a portion of the outer surface of the first dielectric 278 roughly in the center thereof. The second electrode 288 is positioned in contact with a portion of the outer surface of the second dielectric 280 at a first end thereof. A portion of the first electrode 286 is aligned with a portion of the second electrode 288. The third electrode 290 is positioned in contact with a portion of the outer surface of the third dielectric 282 roughly in the center thereof. The fourth electrode 292 is positioned in contact with a portion of the outer surface of the fourth dielectric 284 at a first end thereof. A portion of the third electrode 290 is aligned with a portion of the fourth electrode 292. The fifth electrode 294 is positioned in contact with a portion of the inner surface of the first dielectric 278 at the first end thereof. At least a portion of the fifth electrode 294 is exposed to the first plasma creation chamber 274. The sixth electrode 296 is positioned in contact with a portion of the inner surface of the third dielectric 282 at the first end thereof. At least a portion of the sixth electrode 296 is exposed to the second plasma creation chamber 276.

The first single plasma gate device 298 is formed by the first plasma creation chamber 274, the first dielectric 278, the second dielectric 280, the first electrode 286, the second electrode 288, and the fifth electrode 294. The second single plasma gate device 300 is formed by the second plasma creation chamber 276, the third dielectric 282, the fourth dielectric 284, the third electrode 290, the fourth electrode 292, and the sixth electrode 296.

The first negative ion dual plasma gate device 216 is positioned between the first quadrant wall 226 and the second quadrant wall 228, while the second negative ion dual plasma gate device 218 is positioned between the third quadrant wall 230 and the fourth quadrant wall 232.

Referring to FIGS. 3 and 14, the positive voltage pulse source 40, the negative voltage pulse source 42, and the DC voltage source 44 are utilized with the negative ion dual plasma gate devices 216, 218. The first electrode 286 and the third electrode 290 are electrically connected to the positive voltage pulse source 40 and receive the first electric voltage V1. The second electrode 288 and the fourth electrode 292 are electrically connected to the negative voltage pulse source 42 and receive the second electric voltage V2. The fifth electrode 294 and the sixth electrode 296 are electrically connected to the negative voltage port of the DC voltage source 44 and receive the fourth electric voltage V4, which is a bias voltage. Thus, the fifth electrode 294 and the sixth electrode 296 may be considered "bias electrodes".

The plasma creation process for the negative ion dual plasma gate devices 216, 218 may occur as follows. In the first single plasma gate device 298, the second fluid flows into the first plasma creation chamber 274 and is positioned between the first electrode 286 and the second electrode 288.

The positive voltage pulse of voltage V1 is applied to the first electrode 286 and the negative voltage pulse of voltage V2 is applied to the second electrode 288. The application of the two voltage pulses creates a high-strength first electric field between the first electrode 286 and the second electrode 288. The electric field energizes, or charges, the first fluid which creates a first plasma (cloud). The first plasma is in a state in which charge is separated and electrons may be either extracted from, or injected into, the constituents (atoms or molecules) of the plasma. The negative DC voltage of the fourth electric voltage V4 applied to the fifth electrode 294 injects electrons into the constituents of the first plasma, which provides electron injection. The electron injection results in at least a portion of the first plasma constituents becoming negative ions. After the two voltage pulses subside and the first electric field no longer exists, the negative ions are in the presence of the negative DC voltage from the fifth electrode 294. The negative ions experience a force of repulsion coming from an outer edge of the first plasma creation chamber 274 and migrate toward an inner edge of the first plasma creation chamber 274, where they exit the first plasma creation chamber 274 and travel through a passageway to the plasma product chamber 220.

In the second single plasma gate device 300, a substantially similar process occurs at roughly the same time or a different time. The second fluid flows into the second plasma creation chamber 276 and is positioned between the third electrode 290 and the fourth electrode 292. The positive voltage pulse of voltage V1 is applied to the third electrode 290 and the negative voltage pulse of voltage V2 is applied to the fourth electrode 292. The application of the two voltage pulses creates a high-strength second electric field between the third electrode 290 and the fourth electrode 292. The electric field energizes, or charges, the first fluid which creates a second plasma (cloud). The second plasma is in a state in which charge is separated and electrons may be either extracted from, or injected into, the constituents (atoms or molecules) of the plasma. The negative DC voltage of the fourth electric voltage V4 applied to the sixth electrode 268 injects electrons into the constituents of the second plasma, which provides electron injection. The electron injection results in at least a portion of the second plasma constituents becoming negative ions. After the two voltage pulses subside and the second electric field no longer exists, the negative ions are in the presence of the negative DC voltage from the sixth electrode 296. The negative ions experience a force of repulsion coming from an outer edge of the second plasma creation chamber 276 and migrate toward an inner edge of the second plasma creation chamber 276, where they exit the second plasma creation chamber 276 and travel through a passageway to the plasma product chamber 220.

The processes for plasma creation in the first single plasma gate device 298 and the second single plasma gate device 300 occur in the first negative ion dual plasma gate device 216 and the second negative ion dual plasma gate device 218 at roughly the same time or a different time. In exemplary embodiments, the first negative ion dual plasma gate device 216 and the second negative ion dual plasma gate device 218 may each receive the first fluid. In other embodiments, the first negative ion dual plasma gate device 216 may receive the first fluid, while the second negative ion dual plasma gate device 218 may receive the second fluid or a different fluid.

The plasma product chamber 220 is positioned along the central longitudinal axis of the housing 202 within the opening of the core wall 236 of the central block 234. The plasma product chamber 220 provides a space where bonding between the positive plasma ions and the negative plasma ions can occur.

The catalytic membrane 222 enhances the reaction or bonding of the plasma ions produced in the positive ion dual plasma gate devices 212, 214 and the negative ion dual plasma gate devices 216, 218. The catalytic membrane 222 includes four side walls 302, 304, 306, 308 that are planar and a central wall 310 that has a hollow cylindrical shape. One edge of each side wall 302, 304, 306, 308 is connected to the central wall 310, such that each side wall 302, 304, 306, 308 extends radially outward from the central wall 310. The side walls 302, 304, 306, 308 are spaced along the circumference of the central wall 310 by an angle of approximately 90 degrees. The catalytic membrane 222 may be formed from a metal composite or a ceramic composite which is porous such that there are a plurality of openings in each side wall 302, 304, 306, 308 and the central wall 310. The openings allow plasma ions to pass through each side wall 302, 304, 306, 308 and the central wall 310. The catalytic membrane 222 is positioned within the housing 202 such that each side wall 302, 304, 306, 308 is located in the passageway between two adjacent interior walls 238, 240, 242, 244, and a longitudinal axis of the central wall 310 is collocated with the longitudinal axis of the housing 202.

The fluid outlet 224 provides a pathway for the plasma product to exit the multi plasma gate device 200. The fluid outlet 224 is connected to one end of the plasma product chamber 220 and connected to a coupler attached to the housing 202 at one end of the central block 234.

The multi plasma gate device 200 may operate as follows. Source fluids, including gases such as hydrogen gas or nitrogen gas, or vapor, are supplied to the fluid inlets 204, 206, 208, 210 through the couplers located on exterior surfaces of the housing 202. The first fluid may flow through the first fluid inlet 204 and the second fluid inlet 206 to the first positive ion dual plasma gate device 212 and the second positive ion dual plasma gate device 214, respectively. Following plasma creation processes described above, positive plasma ions exit the plasma creation chamber 246, 248 of the positive ion dual plasma gate devices 212, 214. The positive plasma ions encounter the side walls 302, 304, 306, 308 and/or the central wall 310 of the catalytic membrane 222. The second fluid may flow through the third fluid inlet 208 and the fourth fluid inlet 210 to the first negative ion dual plasma gate device 216 and the second negative ion dual plasma gate device 218, respectively. Following plasma creation processes described above, negative plasma ions exit the plasma creation chambers 274, 276 of the negative ion dual plasma gate devices 216, 218. The negative plasma ions encounter the side walls 302, 304, 306, 308 and/or the central wall 310 of the catalytic membrane 222. Some plasma ions may travel through the side walls 302, 304, 306, 308 and bond with the opposite charge plasma ions. Other plasma ions may travel to the central wall 310 and either gather to bond with opposite charge plasma ions or pass through to the space surrounded by the central wall 310 and bond with opposite charge plasma ions to form a catalyzed product. Thus, as shown in FIG. 12, the plasma product chamber 220 may include plasma product which has some unbonded plasma ions and some neutral plasma constituents and catalyzed product which has mostly neutral plasma constituents. The plasma product exits the plasma product chamber 220 through the fluid outlet 224.

The processes described above, in which a positive voltage pulse is applied to first plurality of electrodes and a negative voltage pulse is applied a second plurality of electrodes to generate a plurality of plasmas, may be repeated indefinitely. In some embodiments, the pulses may be applied to each dual plasma gate device 212, 214, 216, 218 at roughly the same time. In other embodiments, each dual plasma gate device 212, 214, 216, 218, or various combinations of the dual plasma gate devices 212, 214, 216, 218, may receive the pulses at the same frequency, but different phases or delay times.

While the exemplary embodiment of the multi plasma gate device 200 described above receives the first fluid and the second fluid and generates a first plasma from the first fluid and a second plasma from the second fluid, other embodiments of the multi plasma gate device 200 may receive up to eight fluids and may generate up to eight plasmas, the ions of which are received in the plasma product chamber 220.

Figure 15:
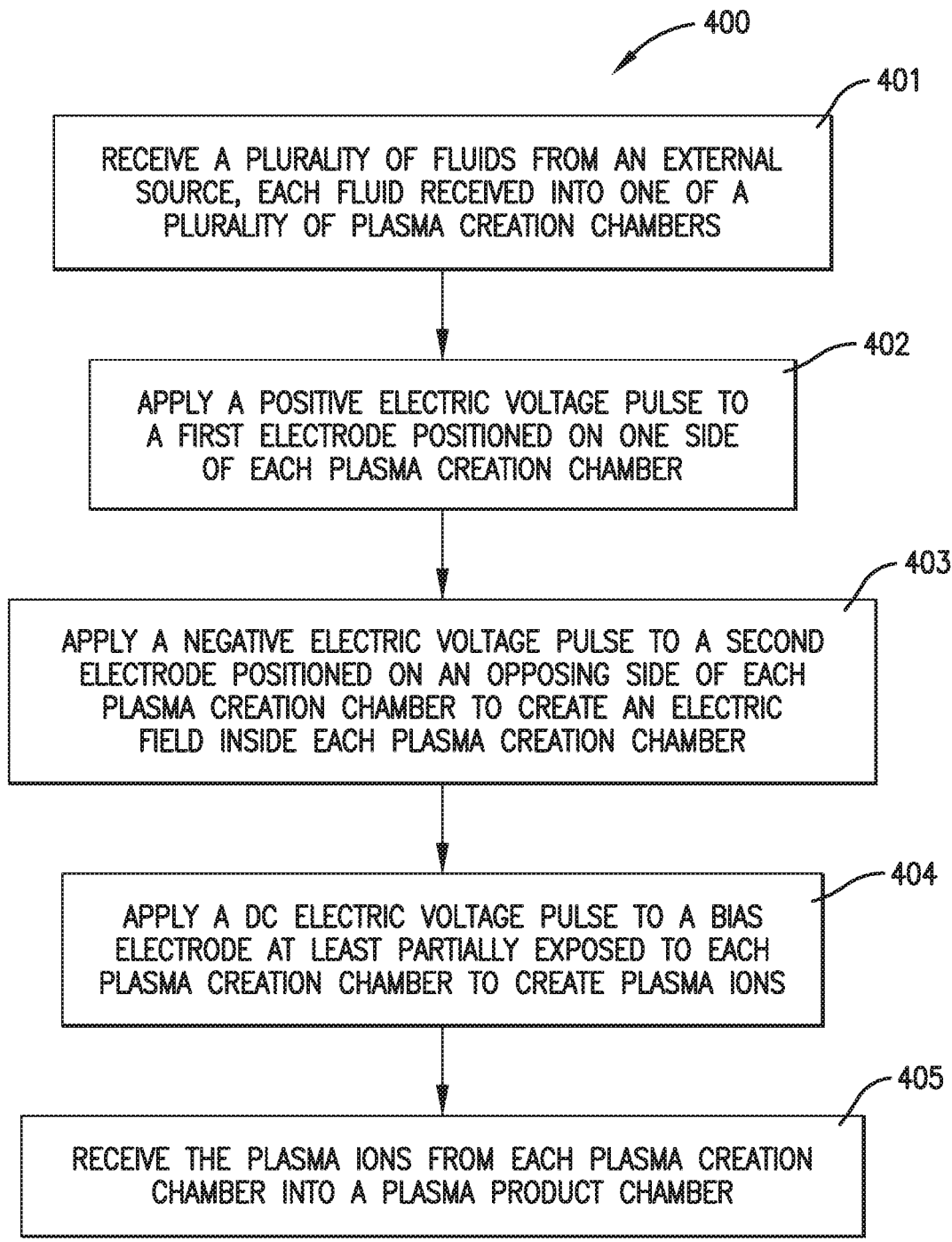
FIG. 15 is a listing of at least a portion of the steps of a method of operating a multi plasma gate device.

FIG. 15 depicts a listing of at least a portion of the steps of an exemplary method 400 for operating a multi plasma gate device, such as the multi plasma gate device 200. The steps may be performed in the order shown in FIG. 15, or they may be performed in a different order. Furthermore, some steps may be performed concurrently as opposed to sequentially. In addition, some steps may be optional or may not be performed.

Referring to step 401, a plurality of fluids are received from an external source into the multi plasma gate device 200. Each fluid may include a gas or a vapor. Each fluid is received into one of a plurality of plasma creation chambers 246, 248, 274, 276.

Referring to step 402, a positive electric voltage pulse is applied to a first electrode 258, 286 which is positioned on one side of each plasma creation chamber 246, 248, 274, 276. The first electrode 258, 286 is positioned in contact with a portion of the outer surface of a first dielectric 250, 278, which also defines a first boundary of each plasma creation chamber 246, 248, 274, 276.

Referring to step 403, a negative electric voltage pulse is applied to a second electrode 260, 288 which is positioned on an opposing side of each plasma creation chamber 246, 248, 274, 276. The second electrode 260, 288 is positioned in contact with a portion of the outer surface of a second dielectric 252, 280, which also defines an opposing second boundary of each plasma creation chamber 246, 248, 274, 276. The application of the positive and negative electric voltage pulses creates a high-strength electric field between the first electrode 258, 286 and the second electrode 260, 288. The electric field energizes, or charges, the fluid which creates a plasma (cloud). The plasma is in a state in which charge is separated and electrons may be either extracted from, or injected into, the constituents (atoms or molecules) of the plasma.

Referring to step 404, a DC electric voltage is applied to a bias electrode 266, 268, 294, 296 which is at least partially exposed to each plasma creation chamber 246, 248, 274, 276. The DC electric voltage manipulates the electrons and either extracts electrons from, or injects electrons into, the plasma, creating positive plasma ions or negative plasma ions, respectively.

Referring to step 405, the positive plasma ions and/or the negative plasma ions are received into a plasma product chamber 220. The plasma ions flow into the plasma product chamber 220 from each of the plasma creation chambers 246, 248, 274, 276.

ADDITIONAL CONSIDERATIONS

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. A multi plasma gate device comprising:
   a plasma creation chamber in which plasma is created, the plasma creation configured to receive a first fluid and a second fluid;
   a first dielectric forming a first portion of an upper boundary of the plasma creation chamber, a second dielectric forming a first portion of a lower boundary of the plasma creation chamber, a third dielectric forming a second portion of the upper boundary of the plasma creation chamber, and a fourth dielectric forming a second portion of the lower boundary of the plasma creation chamber, each of the four dielectrics including an inner surface facing the plasma creation chamber and an outer surface facing away from the plasma creation chamber;
   a first electrode in contact with the outer surface of the first dielectric and a second electrode in contact with the outer surface of the second dielectric, the first electrode configured to receive a first electric voltage, the second electrode configured to receive a second electric voltage, the first and second electric voltages in combination generating a first electric field in the plasma creation chamber through which the first fluid flows creating a first plasma;
   a third electrode in contact with the outer surface of the third dielectric and a fourth electrode in contact with the outer surface of the fourth dielectric, the third electrode configured to receive the first electric voltage, the fourth electrode configured to receive the second electric voltage, the first and second electric voltages in combination generating a second electric field in the plasma creation chamber through which the second fluid flows creating a second plasma;
   a fifth electrode at least partially exposed to the plasma creation chamber, the fifth electrode configured to receive a third electric voltage to manipulate electrons in the first plasma and create plasma ions with a first polarity; and a sixth electrode at least partially exposed to the plasma creation chamber, the sixth electrode configured to receive a fourth electric voltage to manipulate electrons in the second plasma and create plasma ions with a second polarity, such that plasma ions with the first polarity bond with plasma ions of the second polarity.

2. The multi plasma gate device of claim 1, wherein the first electric voltage includes a sequence of positive voltage pulses and the second electric voltage includes a sequence of negative voltage pulses such that each negative voltage pulse occurs at roughly the same time as a successive one of the positive voltage pulses.

3. The multi plasma gate device of claim 1, wherein the third electric voltage includes a positive DC voltage and the fourth electric voltage includes a negative DC voltage.

4. The multi plasma gate device of claim 1, wherein at least a portion of the first electrode is aligned with at least a portion of the second electrode.

5. The multi plasma gate device of claim 1, wherein at least a portion of the third electrode is aligned with at least a portion of the fourth electrode.

6. The multi plasma gate device of claim 1, wherein the first fluid enters the plasma creation chamber from a first side of the plasma creation chamber, the second fluid enters the plasma creation chamber from a second side of the plasma creation chamber opposite from the first side, and the plasma product exits the plasma creation chamber between the first dielectric and the fourth dielectric.

7. A multi plasma gate device comprising:
a housing including four side walls connected to one another and having a quadrilateral cross section;
a first positive ion dual plasma gate device positioned along a first side wall and a second positive ion dual plasma gate device positioned along a second side wall opposite the first side wall, each positive ion dual plasma gate device including
a plasma creation chamber configured to receive a first fluid,
a first electric field generator positioned on a first side of the plasma creation chamber and configured to generate a first electric field and a second electric field generator positioned on a second side of the plasma creation chamber and configured to generate a second electric field, the first electric field and the second electric field energizing the first fluid to create a first plasma, and
a bias electrode at least partially exposed to the plasma creation chamber and configured to receive a first bias electric voltage to extract electrons from the first plasma and create positive plasma ions;
a first negative ion dual plasma gate device positioned along a third side wall and a second negative ion dual plasma gate device positioned along a fourth side wall opposite the third side wall, each negative ion dual plasma gate device including
a plasma creation chamber configured to receive a second fluid,
a first electric field generator positioned on a first side of the plasma creation chamber and configured to generate a third electric field and a second electric field generator positioned on a second side of the plasma creation chamber and configured to generate a fourth electric field, the third electric field and the fourth electric field energizing the second fluid to create a second plasma, and
a bias electrode at least partially exposed to the plasma creation chamber and configured to receive a second bias electric voltage to inject electrons into the second plasma and create negative plasma ions; and
a plasma product chamber configured to receive the positive plasma ions and the negative plasma ions so that at least a portion of the positive plasma ions bond with at least a portion of the negative plasma ions to create a plasma product.

8. The multi plasma gate device of claim 7, wherein the first electric field generator of each positive ion dual plasma gate device includes
a first dielectric forming a first boundary of the plasma creation chamber and a second dielectric forming an opposing second boundary of the plasma creation chamber, each dielectric including an inner surface facing the plasma creation chamber and an outer surface facing away from the plasma creation chamber, and
a first electrode in contact with the outer surface of the first dielectric and a second electrode in contact with a first portion of the outer surface of the second dielectric, the first electrode configured to receive a first electric voltage, the second electrode configured to receive a second electric voltage, and
the second electric field generator of each positive ion dual plasma gate device includes the first dielectric, the second dielectric, the first electrode, and a third electrode in contact with a second portion of the outer surface of the second dielectric, the third electrode configured to receive the second electric voltage.

9. The multi plasma gate device of claim 8, wherein the first bias electric voltage includes a positive DC voltage, the first electric voltage includes a sequence of positive voltage pulses, and the second electric voltage includes a sequence of negative voltage pulses such that each negative voltage pulse occurs at roughly the same time as a successive one of the positive voltage pulses.

10. The multi plasma gate device of claim 8, wherein, for each positive ion dual plasma gate device, at least a first portion of the first electrode is aligned with at least a portion of the second electrode and at least a second portion of the first electrode is aligned with at least a portion of the third electrode.

11. The multi plasma gate device of claim 7, wherein the first electric field generator of each negative ion dual plasma gate device includes
a first dielectric forming a first boundary of the plasma creation chamber and a second dielectric forming an opposing second boundary of the plasma creation chamber, each dielectric including an inner surface facing the plasma creation chamber and an outer surface facing away from the plasma creation chamber, and
a first electrode in contact with the outer surface of the first dielectric and a second electrode in contact with a first portion of the outer surface of the second dielectric, the second electrode configured to receive a first electric voltage, the first electrode configured to receive a second electric voltage, and
the second electric field generator of each negative ion dual plasma gate device includes the first dielectric, the second dielectric, the first electrode, and a third electrode in contact with a second portion of the outer surface of the second dielectric, the third electrode configured to receive the first electric voltage.

12. The multi plasma gate device of claim 11, wherein the second bias electric voltage includes a negative DC voltage, the first electric voltage includes a sequence of positive voltage pulses, and the second electric voltage includes a sequence of negative voltage pulses such that each negative voltage pulse occurs at roughly the same time as a successive one of the positive voltage pulses.

13. The multi plasma gate device of claim 11, wherein, for each negative ion dual plasma gate device, at least a first portion of the first electrode is aligned with at least a portion of the second electrode and at least a second portion of the first electrode is aligned with at least a portion of the third electrode.

14. The multi plasma gate device of claim 7, further comprising a catalytic membrane including a plurality of side walls each connected to a central wall, the catalytic membrane positioned such that the central wall and at least a portion of each side wall are located in the plasma product chamber, each side wall and the central wall including porous surfaces on which positive plasma ions and negative plasma ions can gather and bond.

15. A multi plasma gate device comprising:
- a housing;
- a plurality of single plasma gate devices each configured to create a plasma, each single plasma gate device including
  - a plasma creation chamber including a first end opening and an opposing second end opening, the first end opening configured to receive a fluid,
  - a first dielectric forming a first boundary of the plasma creation chamber and a second dielectric forming an opposing second boundary of the plasma creation chamber, each dielectric including an inner surface facing the plasma creation chamber and an outer surface facing away from the plasma creation chamber,
  - a first electrode in contact with the outer surface of the first dielectric and a second electrode in contact with the outer surface of the second dielectric, the first electrode configured to receive a first electric voltage, the second electrode configured to receive a second electric voltage, the first and second electric voltages in combination generating an electric field in the plasma creation chamber through which the fluid flows creating the plasma, and
  - a bias electrode at least partially exposed to the plasma creation chamber and configured to receive a bias electric voltage to manipulate electrons in the plasma and create plasma ions that have one of two opposing polarities and exit through the second end opening; and
- a plasma product chamber positioned in the center of the housing and configured to receive the plasma ions from each single plasma gate device and wherein at least a portion of the plasma ions having the first polarity bond with at least a portion of the plasma ions having the second polarity to create a plasma product.

16. The multi plasma gate device of claim 15, wherein a first single plasma gate device and a second single plasma gate device are positioned in the housing adjacent to one another and oriented such that one is the mirror image of the other, the first single plasma gate device and the second single plasma gate device forming a dual plasma gate device which generates a first plasma and a second plasma, each plasma having ions of the same polarity.

17. The multi plasma gate device of claim 16, further comprising
- a first dual plasma gate device positioned along a first side of the housing, the first dual plasma gate device configured to generate positive plasma ions,
- a second dual plasma gate device positioned along a second side of the housing opposite to the first side, the second dual plasma gate device configured to generate positive plasma ions,
- a third dual plasma gate device positioned along a third side of the housing, the third dual plasma gate device configured to generate negative plasma ions, and
- a fourth dual plasma gate device positioned along a fourth side of the housing opposite to the third side, the fourth dual plasma gate device configured to generate negative plasma ions,
- wherein each dual plasma gate device is positioned between two other dual plasma gate devices that generate plasma ions of the opposite polarity.

18. The multi plasma gate device of claim 15, wherein the first electric voltage includes a sequence of positive voltage pulses and the second electric voltage includes a sequence of negative voltage pulses such that each negative voltage pulse occurs at roughly the same time as a successive one of the positive voltage pulses.

19. The multi plasma gate device of claim 15, wherein the bias electric voltage applied to the bias electrode included in the first dual plasma gate device and the second dual plasma gate device includes a positive DC voltage, and the bias electric voltage applied to the bias electrode included in the third dual plasma gate device and the fourth dual plasma gate device includes a negative DC voltage.

20. The multi plasma gate device of claim 15, further comprising a catalytic membrane including a plurality of side walls each connected to a central wall, the catalytic membrane positioned such that the central wall and at least a portion of each side wall are located in the plasma product chamber, each side wall and the central wall including porous surfaces on which plasma ions having the first polarity and plasma ions having the second polarity can gather and bond.

* * * * *